United States Patent
Lee et al.

(10) Patent No.: US 12,113,150 B2
(45) Date of Patent: Oct. 8, 2024

(54) STRUCTURE OF MICRO LIGHT-EMITTING DEVICE AND METHOD OF TRANSFERRING MICRO LIGHT-EMITTING DEVICE

(71) Applicant: Korea University Research and Business Foundation, Seoul (KR)

(72) Inventors: In Hwan Lee, Seoul (KR); Gyu Cheol Kim, Seoul (KR)

(73) Assignee: Korea University Research and Business Foundation, Seoul (KR)

(*) Notice: Subject to any disclaimer, the term of this patent is extended or adjusted under 35 U.S.C. 154(b) by 393 days.

(21) Appl. No.: 17/518,771

(22) Filed: Nov. 4, 2021

(65) Prior Publication Data

US 2022/0149236 A1 May 12, 2022

(30) Foreign Application Priority Data

Nov. 6, 2020 (KR) .................. 10-2020-0147435

(51) Int. Cl.
*H01L 33/24* (2010.01)
*H01L 23/00* (2006.01)
(Continued)

(52) U.S. Cl.
CPC .............. *H01L 33/24* (2013.01); *H01L 24/95* (2013.01); *H01L 27/15* (2013.01); *H01L 33/38* (2013.01);
(Continued)

(58) Field of Classification Search
CPC ......... H01L 33/24; H01L 24/95; H01L 27/15; H01L 33/38; H01L 33/62; H01L 25/0655;
(Continued)

(56) References Cited

U.S. PATENT DOCUMENTS

2002/0096994 A1* 7/2002 Iwafuchi ............ H01L 21/6835
257/E27.111
2002/0171089 A1* 11/2002 Okuyama ............ H01L 27/156
257/88
(Continued)

FOREIGN PATENT DOCUMENTS

EP 1420463 A1 * 5/2004 ............ H01L 33/24
JP 2002-261335 A 9/2002
(Continued)

OTHER PUBLICATIONS

Extended European Search report issued on Apr. 4, 2022, in counterpart European Patent Application No. 21206700.3 (11 pages in English).

(Continued)

*Primary Examiner* — S M Sohel Imtiaz
(74) *Attorney, Agent, or Firm* — NSIP Law

(57) ABSTRACT

The present disclosure relates to the structure of a micro light-emitting device and an alignment substrate. The light-emitting device according to one embodiment includes an inclined side surface having a three-dimensional shape. The inclined side surface is formed to protrude from one surface of the micro light-emitting device, has magnetism, and includes two different electrodes formed in one direction. In this case, among the two electrodes, one electrode may be formed on a mesa portion, and the other electrode may be formed on the inclined side surface.

5 Claims, 25 Drawing Sheets

(51) Int. Cl.
  *H01L 27/15* (2006.01)
  *H01L 33/38* (2010.01)
  *H01L 33/62* (2010.01)
  *H01L 25/065* (2023.01)
  *H01L 25/075* (2006.01)
  *H01L 33/00* (2010.01)
  *H01L 33/44* (2010.01)

(52) U.S. Cl.
  CPC .......... *H01L 33/62* (2013.01); *H01L 25/0655* (2013.01); *H01L 25/0753* (2013.01); *H01L 33/0095* (2013.01); *H01L 33/44* (2013.01); *H01L 2224/95101* (2013.01); *H01L 2224/95136* (2013.01); *H01L 2224/95144* (2013.01); *H01L 2924/10157* (2013.01); *H01L 2933/0016* (2013.01); *H01L 2933/0025* (2013.01)

(58) Field of Classification Search
  CPC . H01L 25/0753; H01L 33/0095; H01L 33/44; H01L 2224/95101; H01L 2224/95136; H01L 2224/95144; H01L 33/16; H01L 33/20

See application file for complete search history.

(56) References Cited

U.S. PATENT DOCUMENTS

| | | | |
|---|---|---|---|
| 2015/0276194 A1* | 10/2015 | Lowenthal | H01L 25/0753 362/231 |
| 2016/0056331 A1* | 2/2016 | Kim | B82Y 20/00 257/13 |
| 2019/0006564 A1* | 1/2019 | Sasaki | H01L 33/62 |
| 2020/0168589 A1* | 5/2020 | Kim | H01L 33/62 |

FOREIGN PATENT DOCUMENTS

| | | |
|---|---|---|
| JP | 2002-335016 A | 11/2002 |
| JP | 2003-216052 A | 7/2003 |
| JP | 2020-155428 A | 9/2020 |
| KR | 10-2004-0029301 A | 4/2004 |
| KR | 10-2019-0017691 A | 2/2019 |
| KR | 10-2102818 B1 | 5/2020 |

OTHER PUBLICATIONS

Korean Office Action issued on Jul. 27, 2022, in counterpart Korean Patent Application No. 10-2020-0147435 (4 pages in Korean).

Japanese Office Action issued on Oct. 31, 2022, in counterpart Japanese Patent Application No. 2021-181411 (8 Pages in Japanese).

* cited by examiner

[FIG. 1]
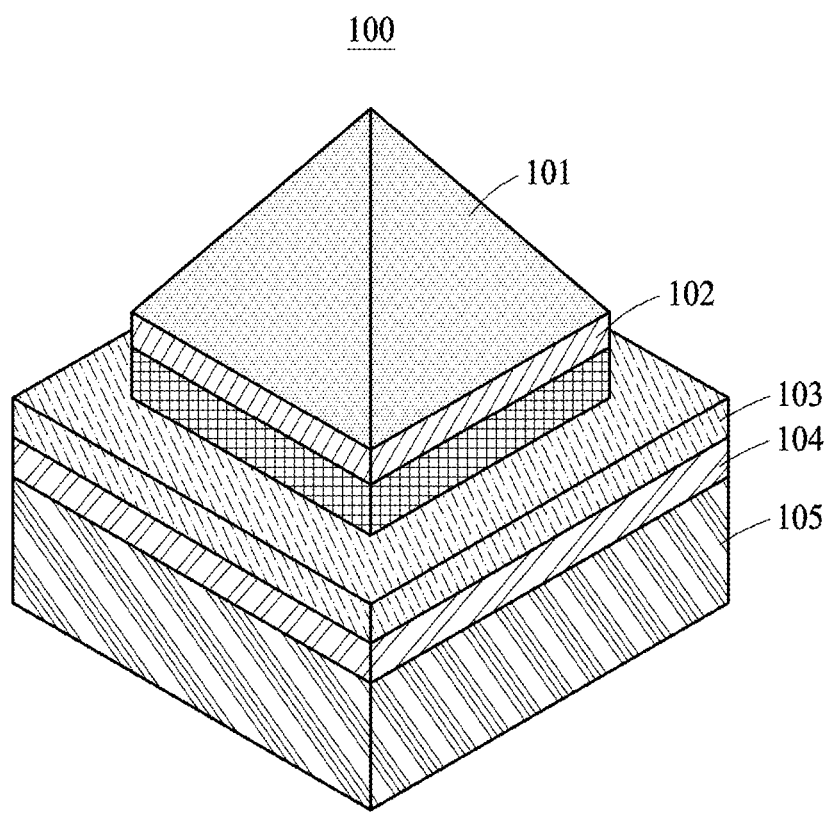

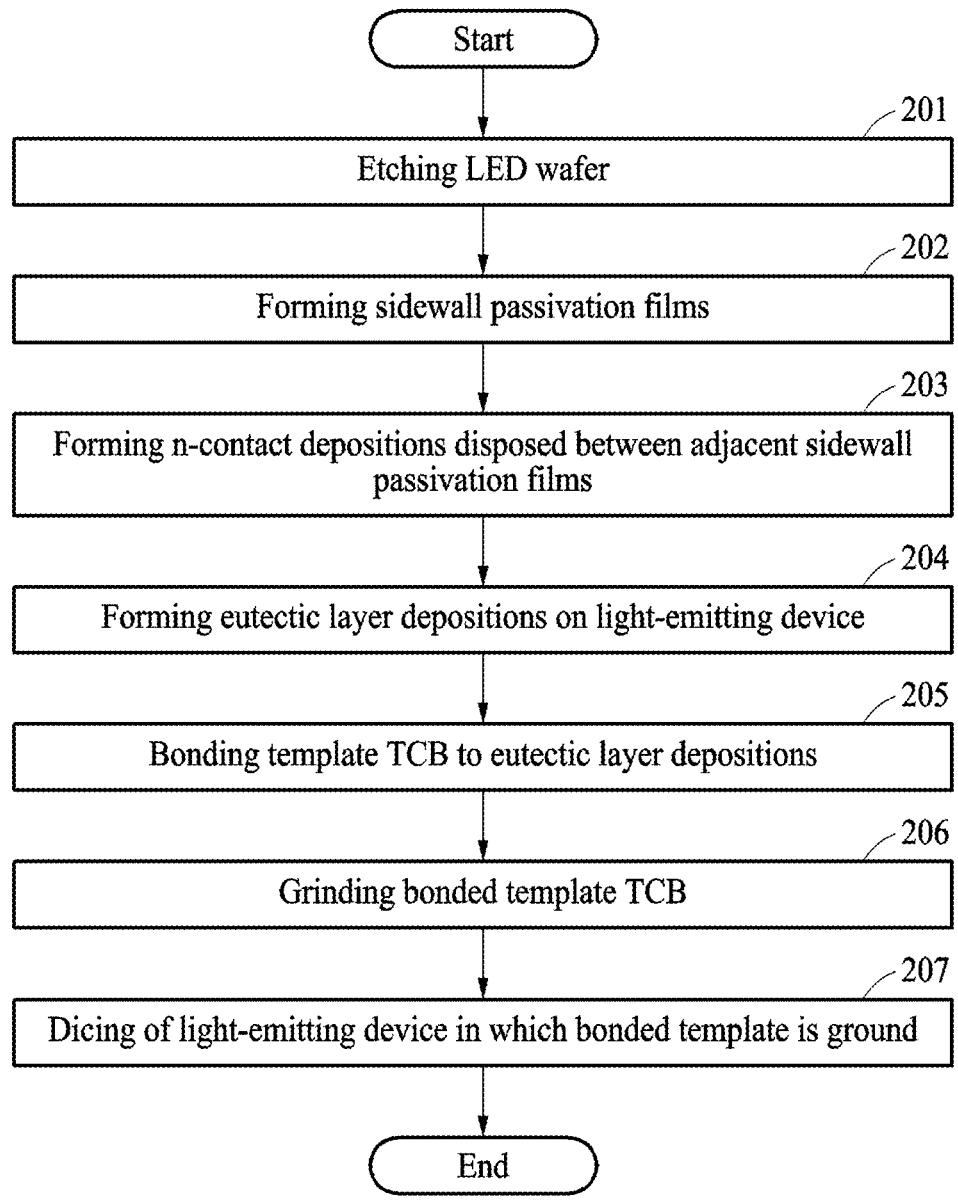

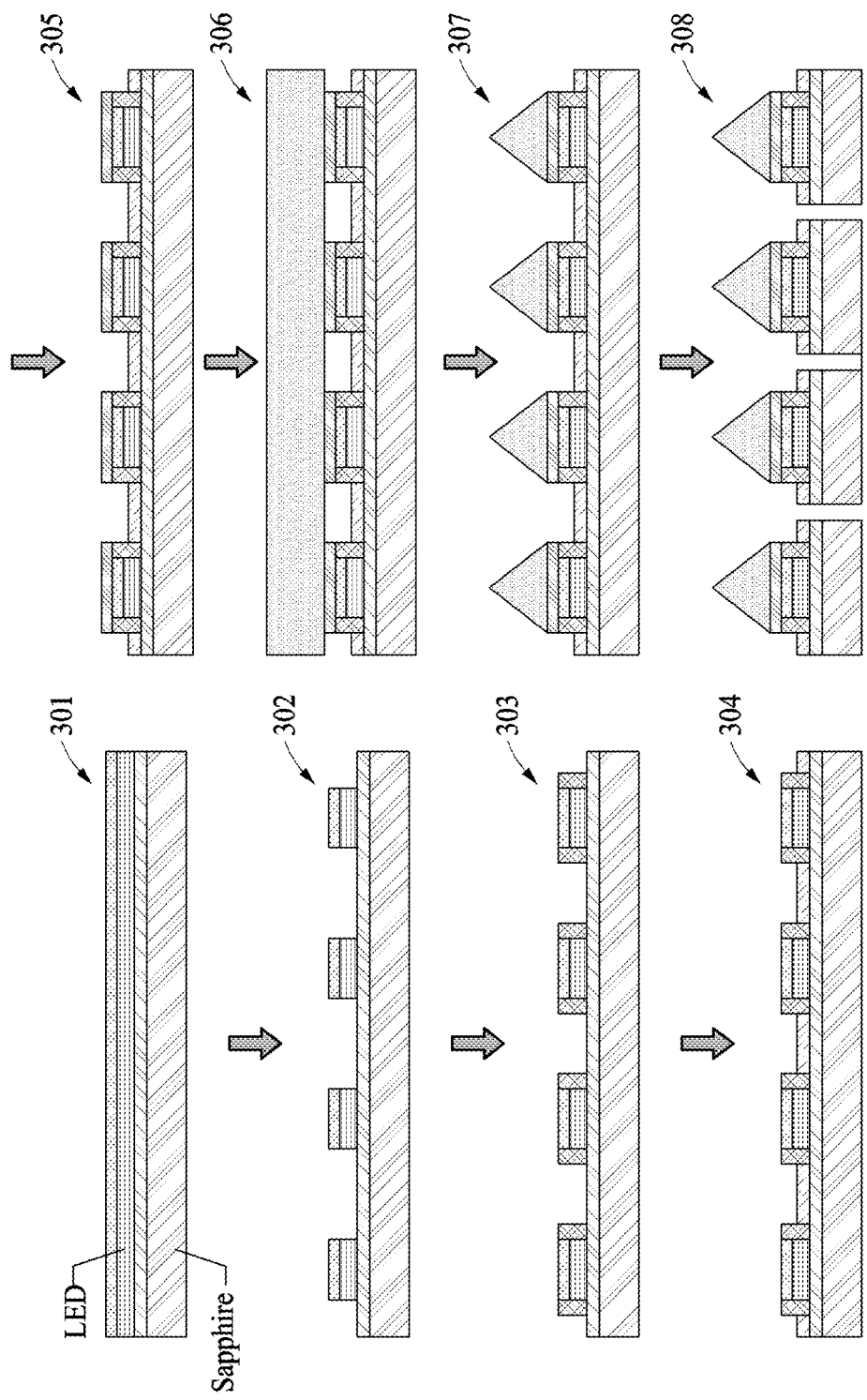
[FIG. 3]

[FIG. 4]
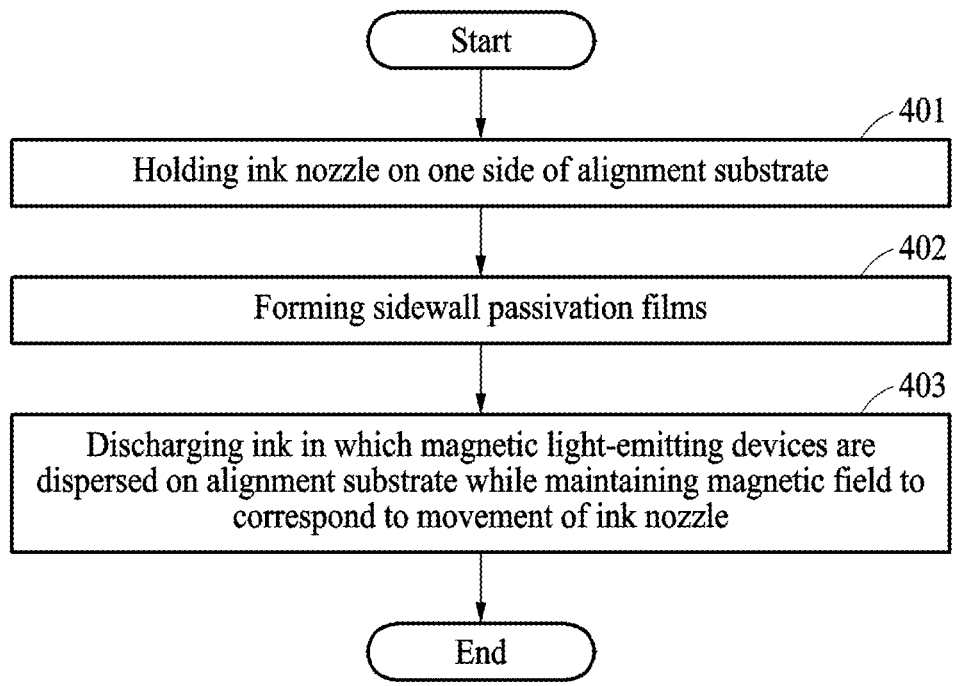

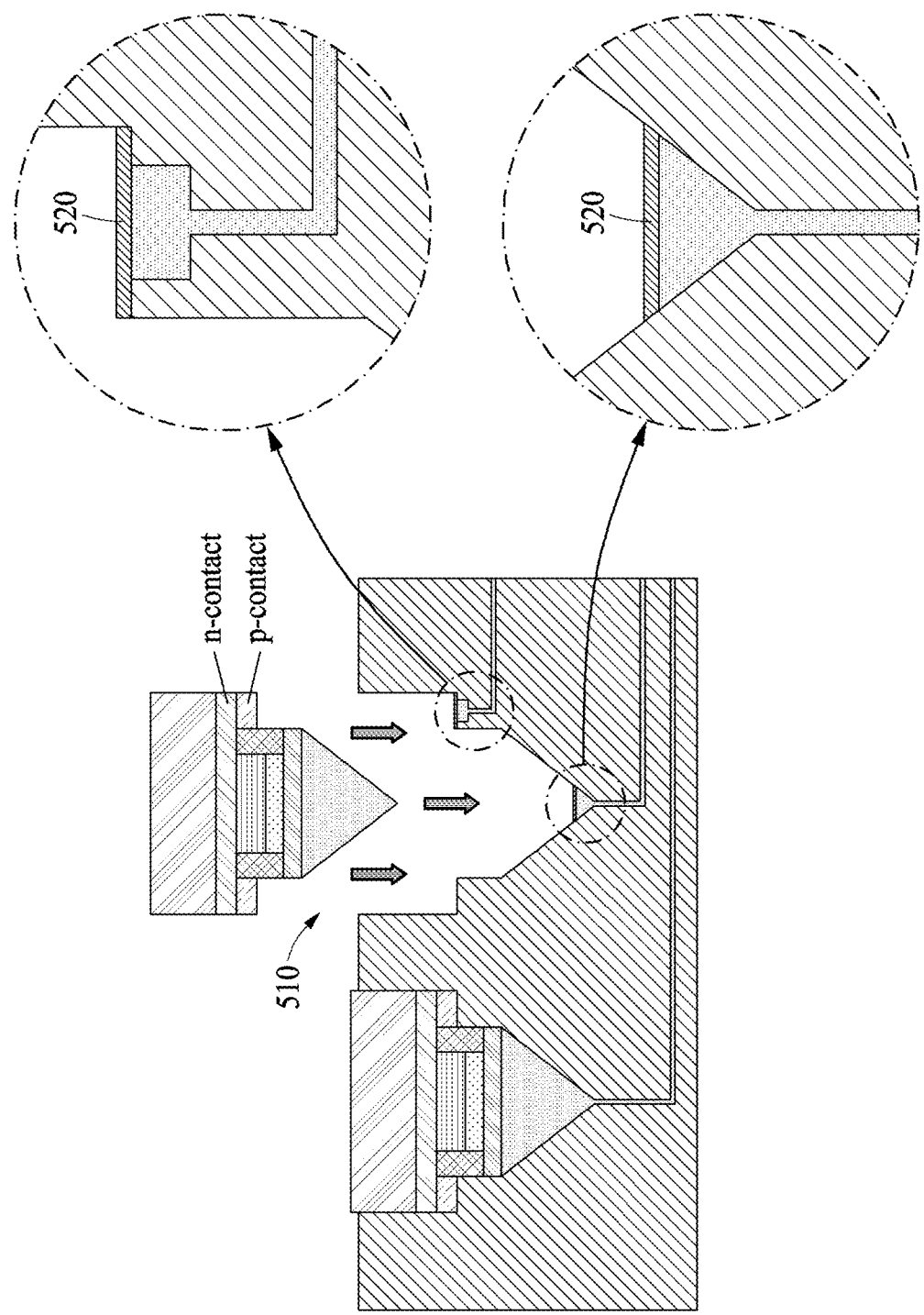

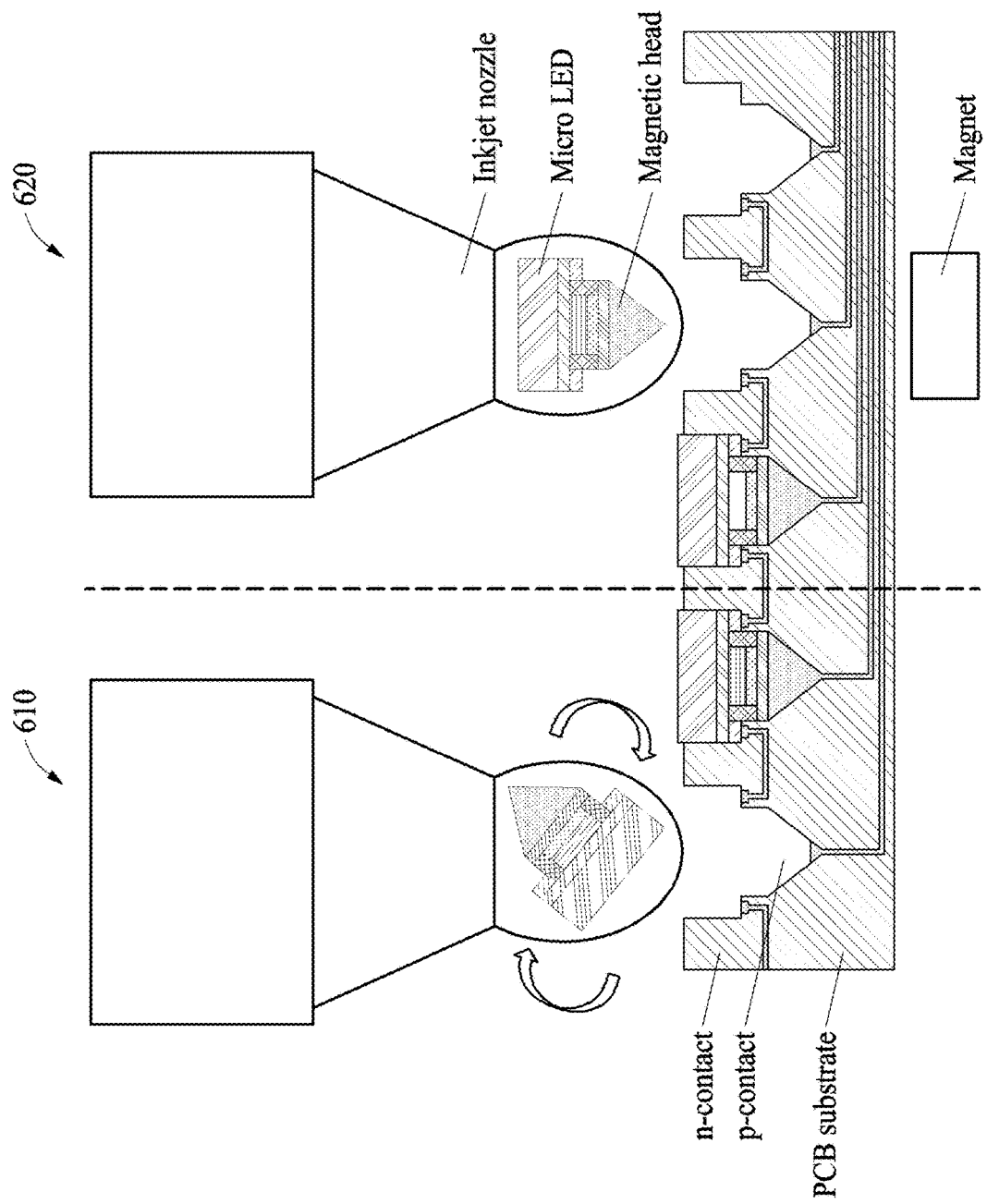
[FIG. 6]

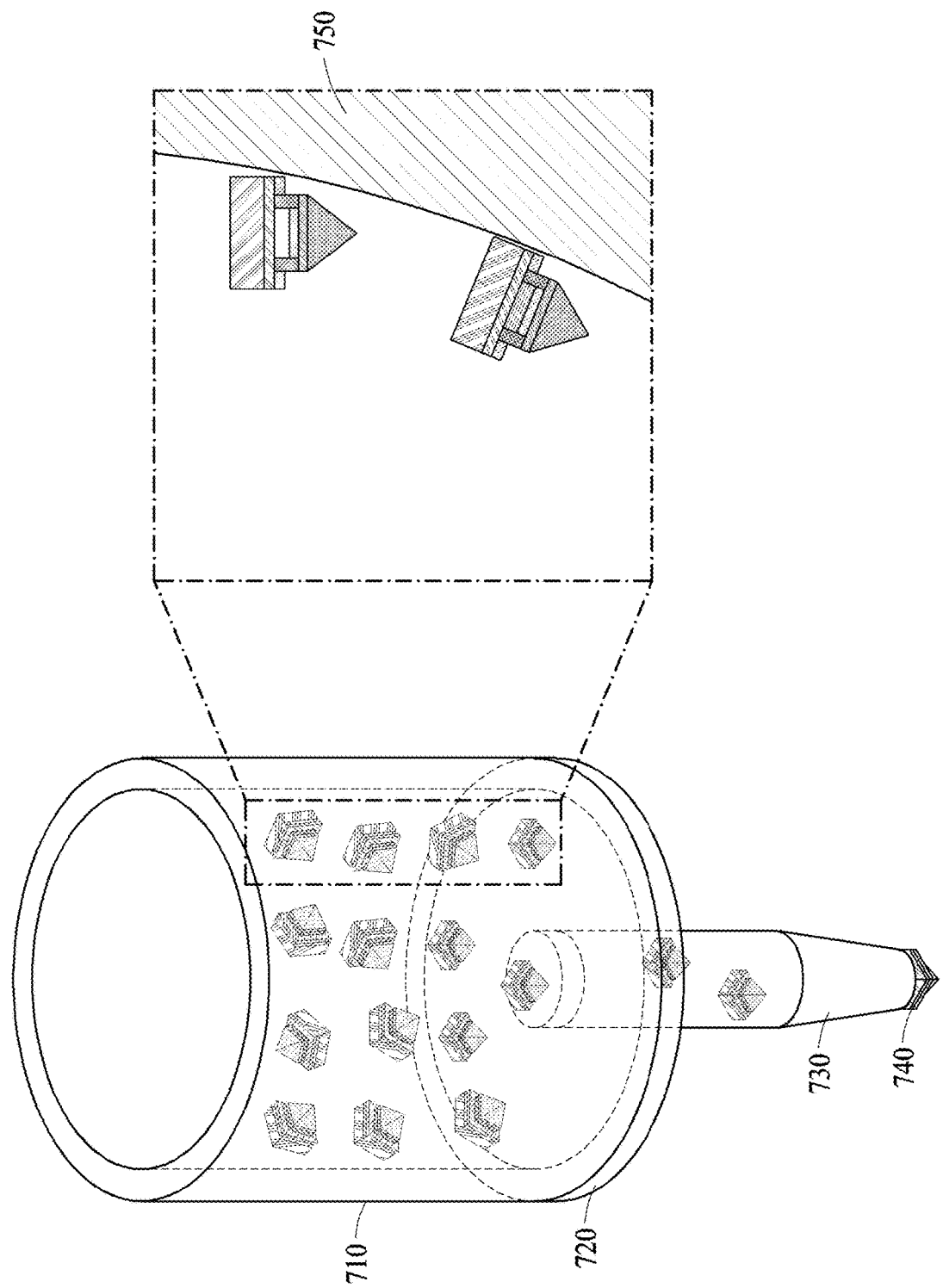
[FIG. 7]

[FIG. 8]
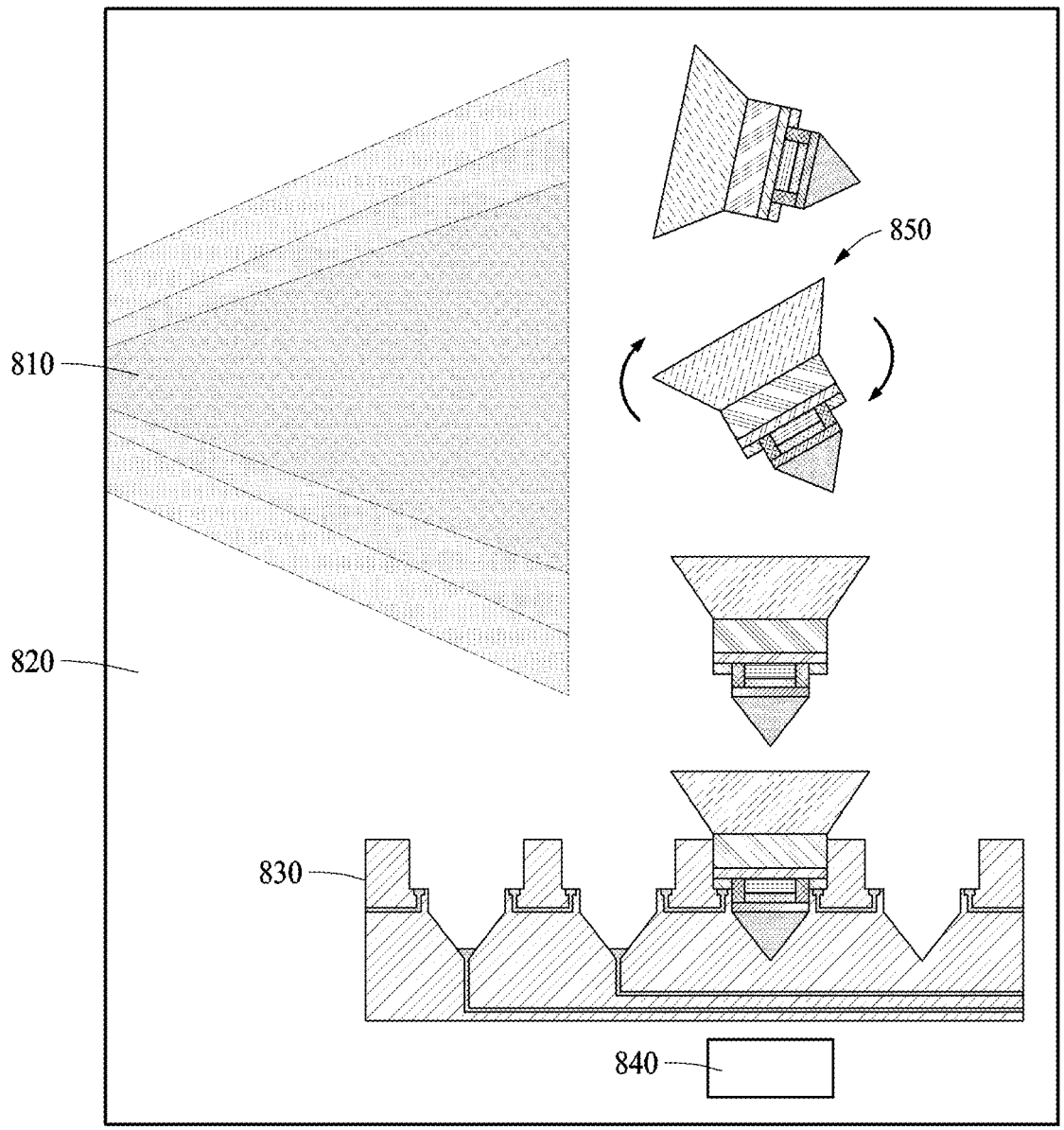

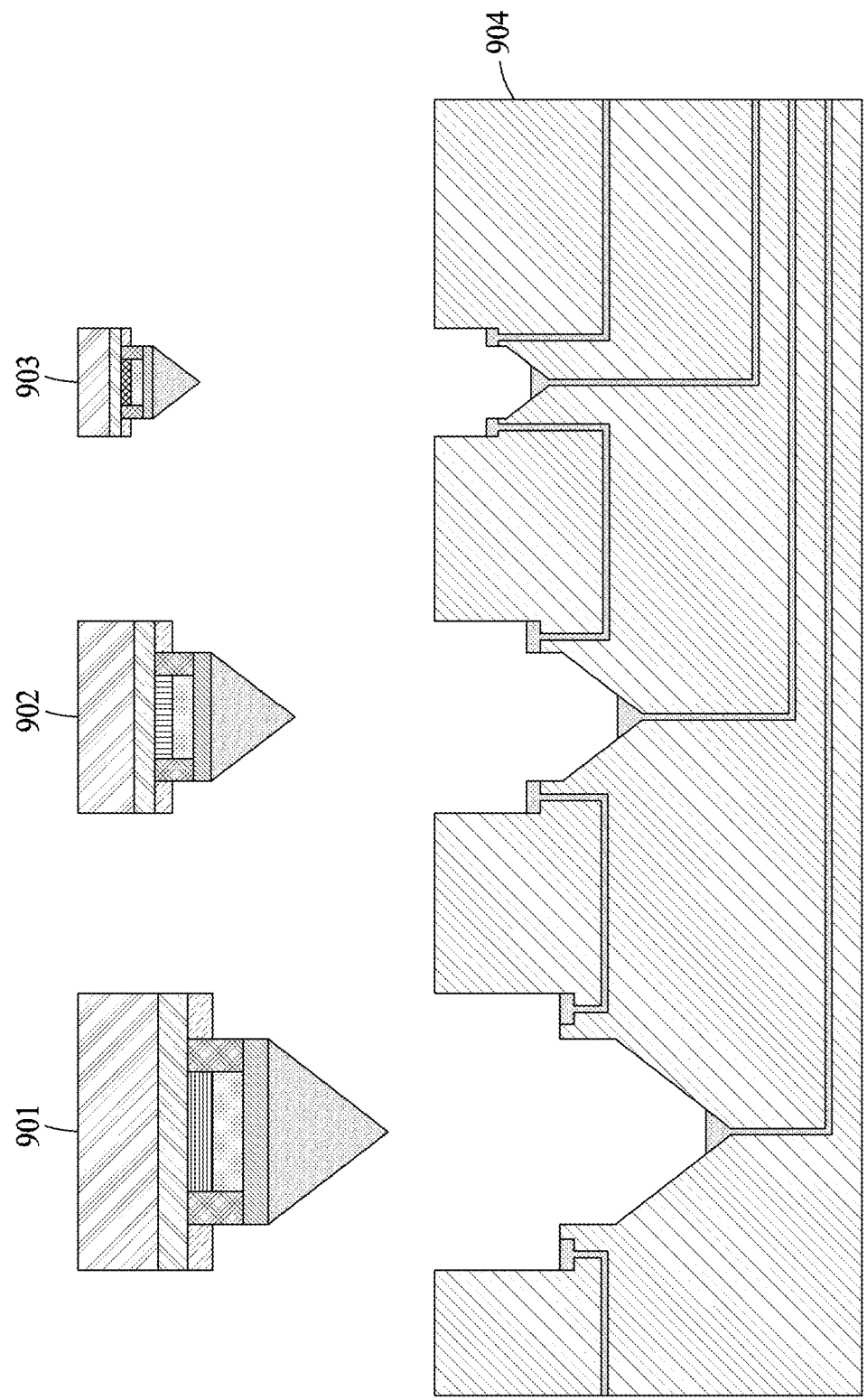
[FIG. 9]

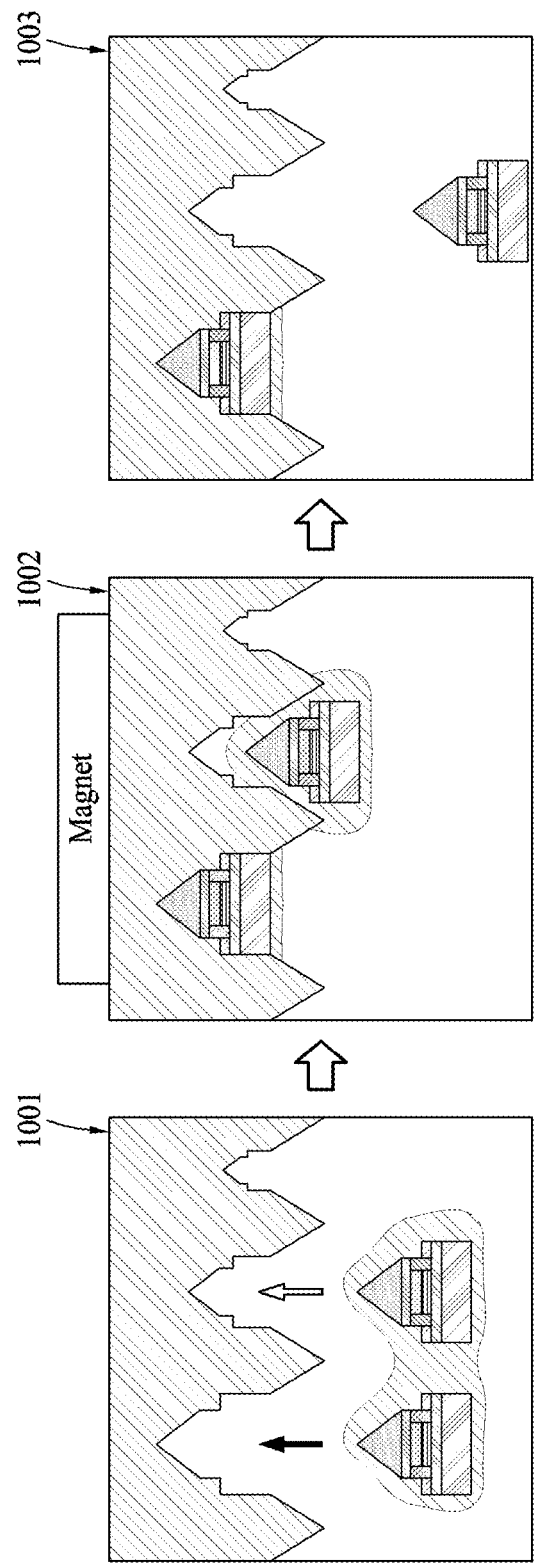
[FIG. 10]

[FIG. 11]
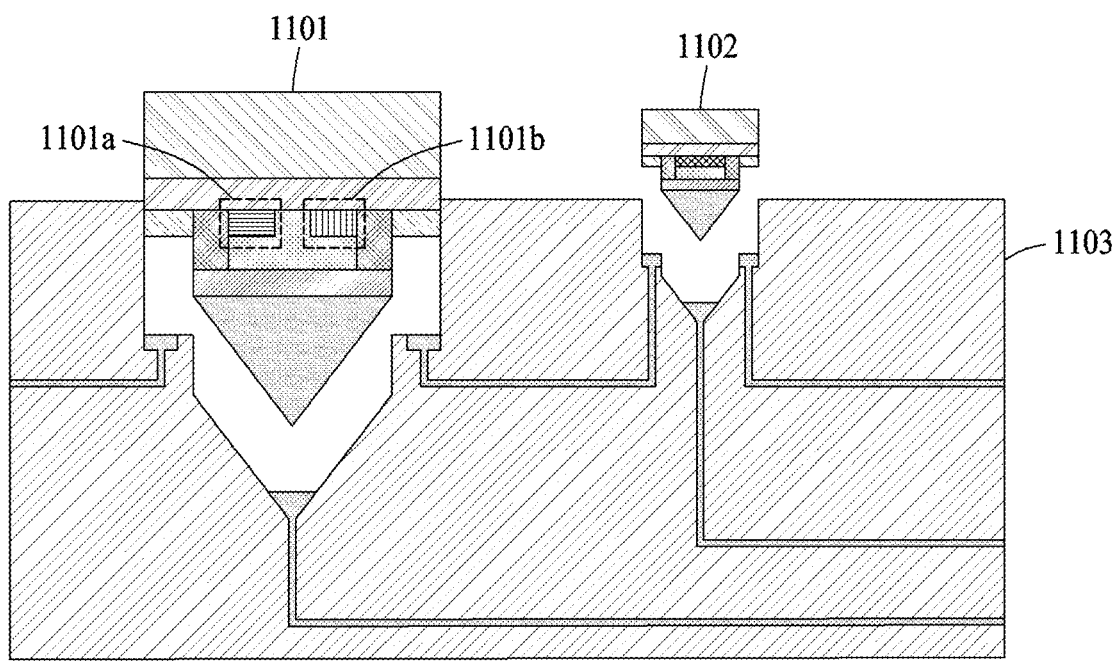

[FIG. 12A]
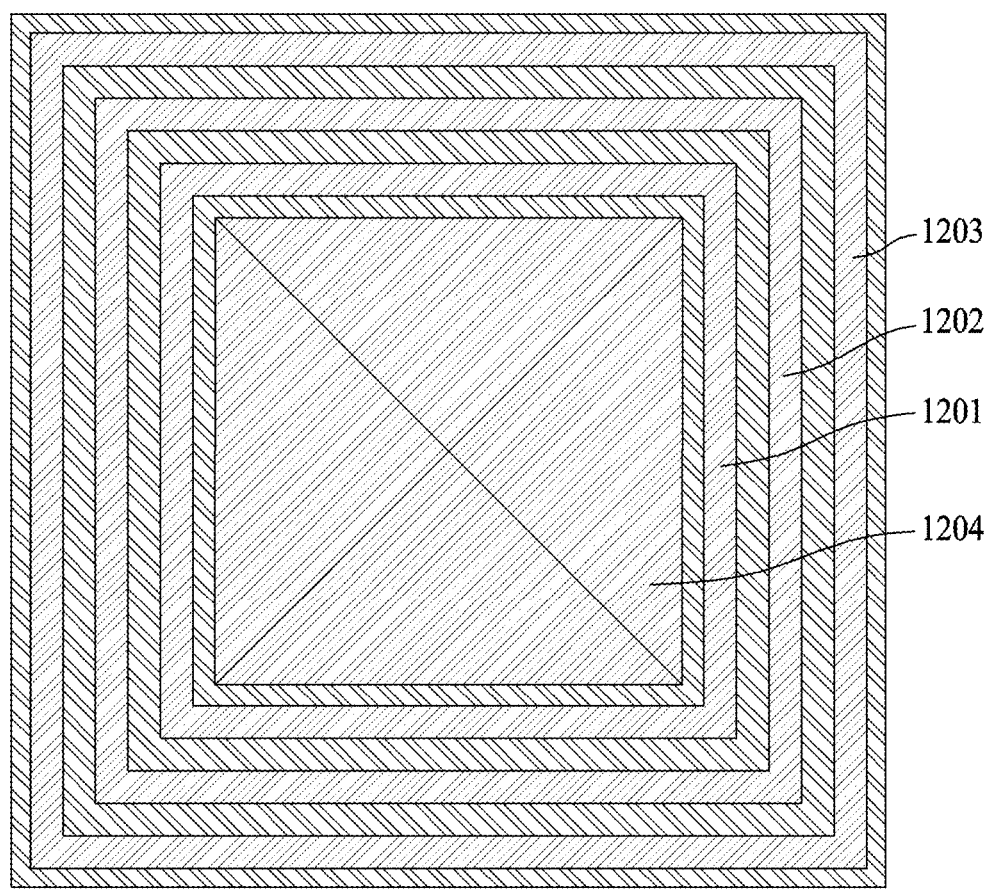

[FIG. 12B]
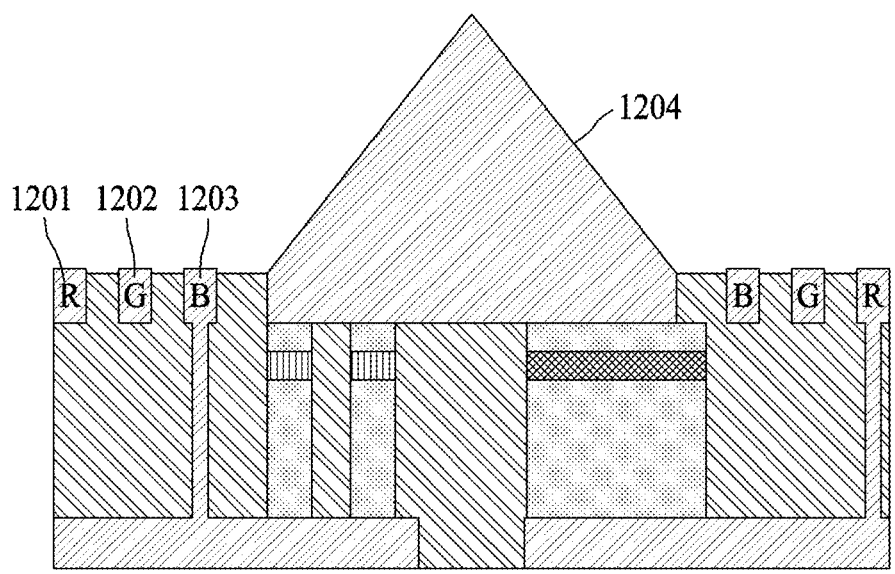

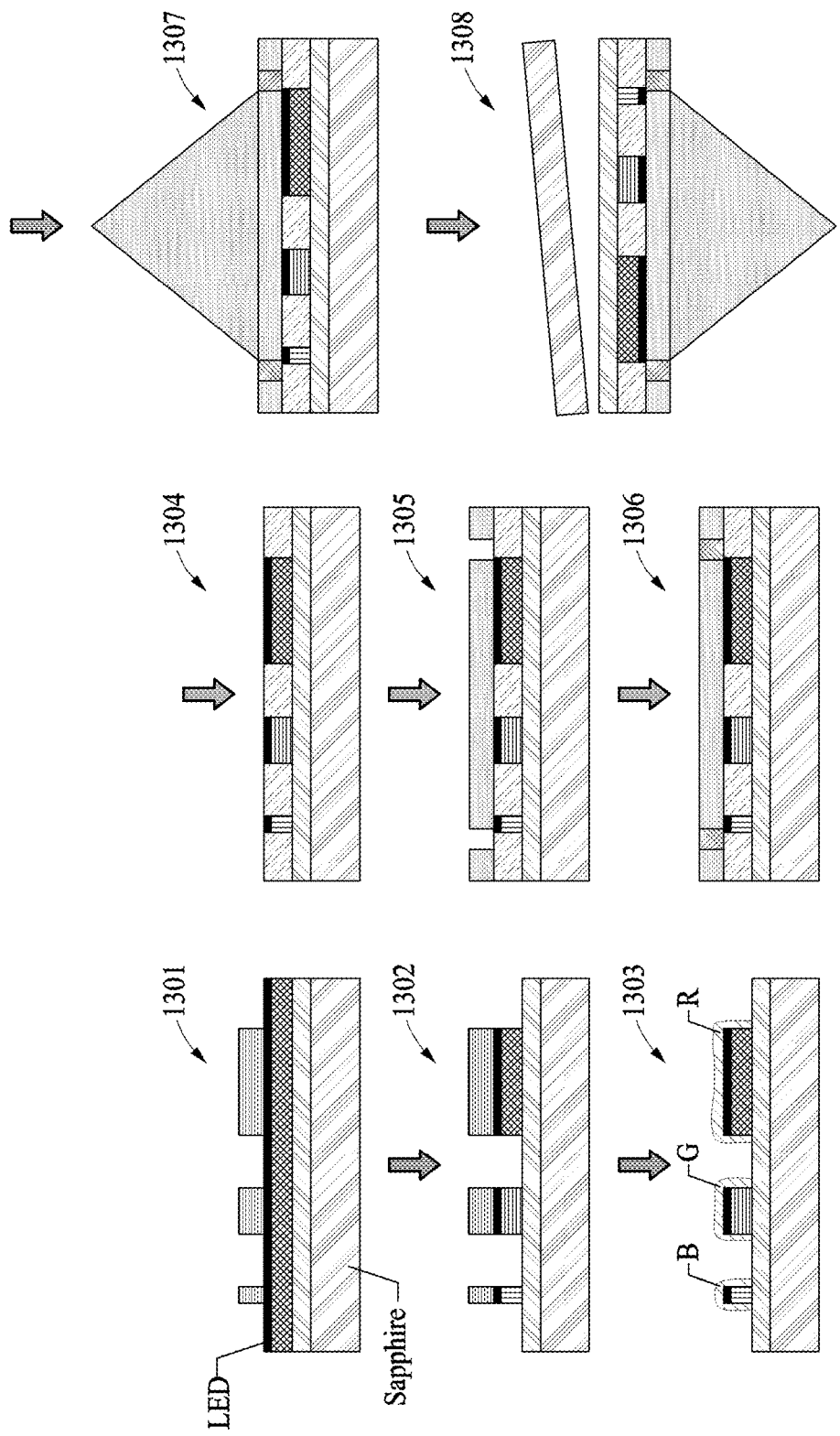
[FIG. 13]

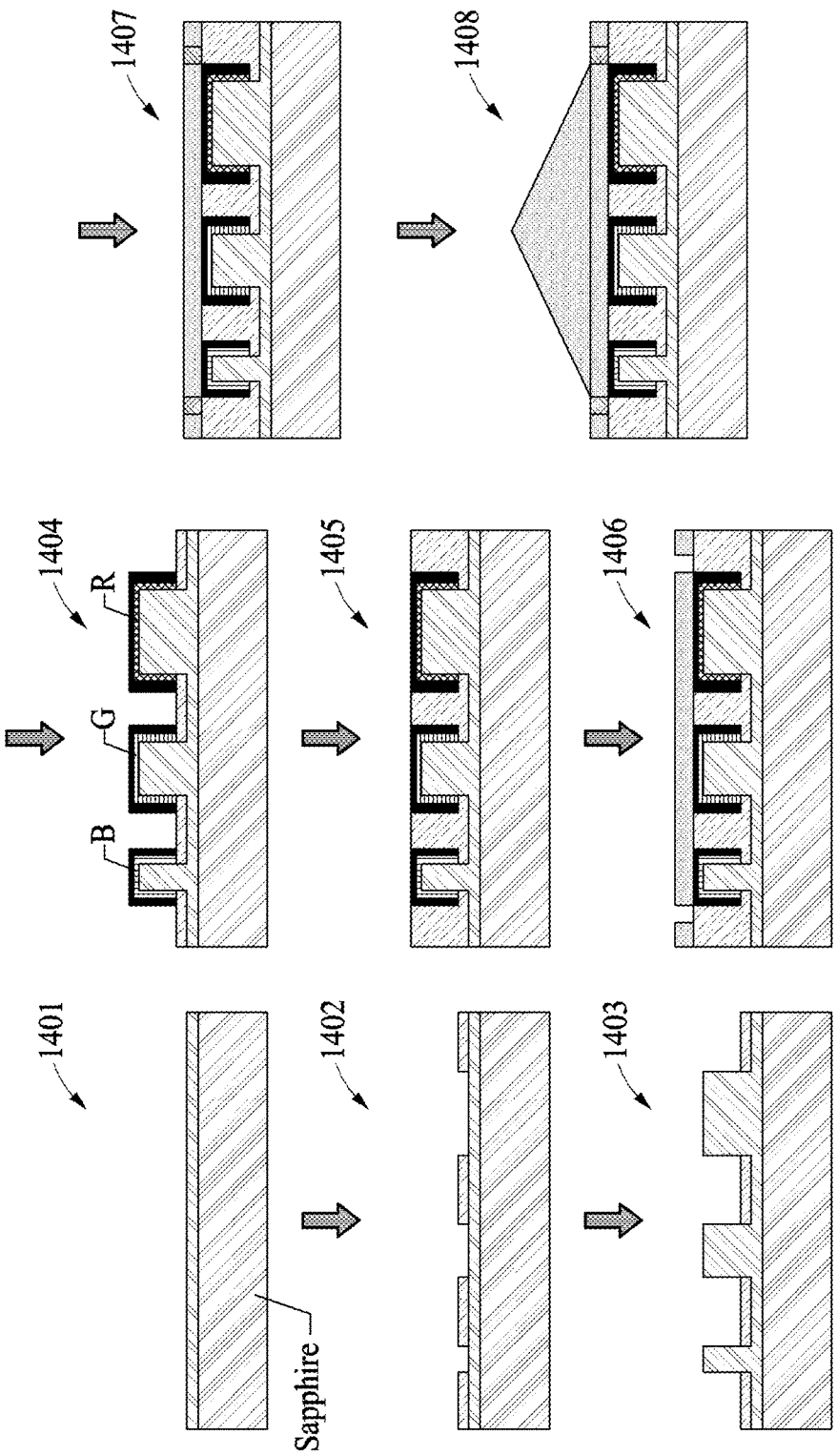
[FIG. 14]

[FIG. 15]
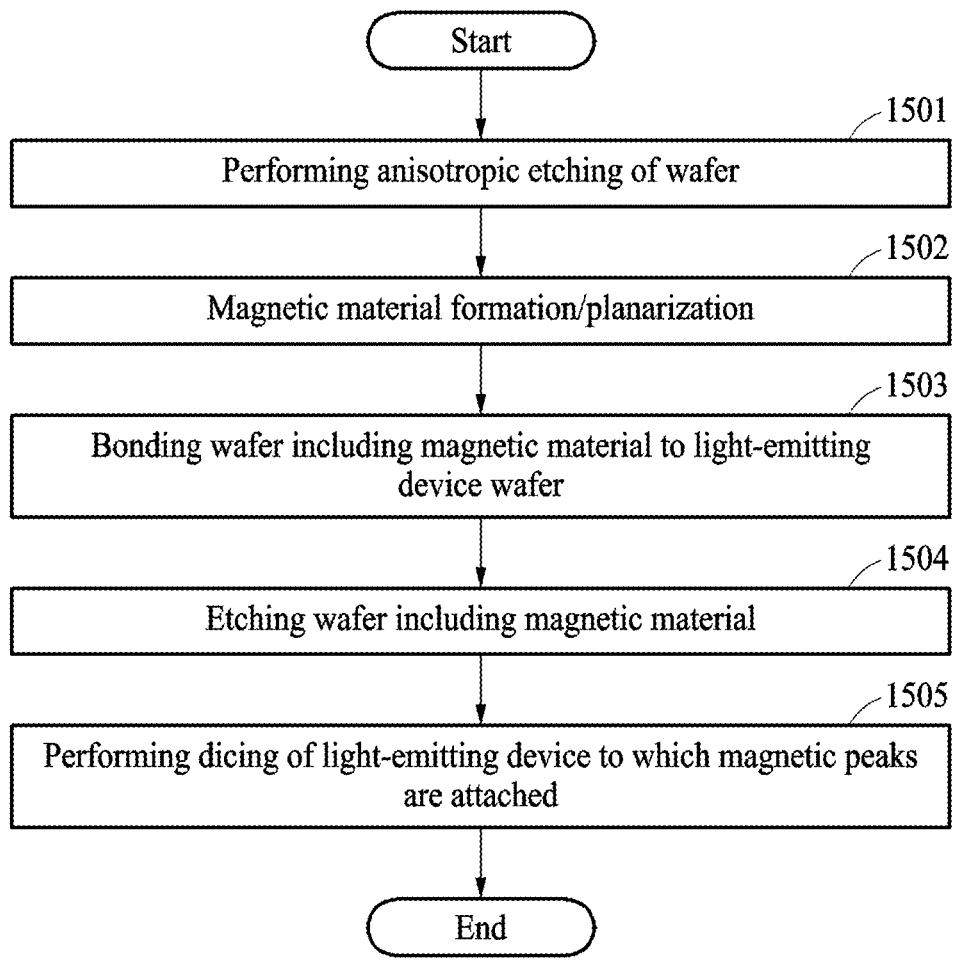

[FIG. 16]
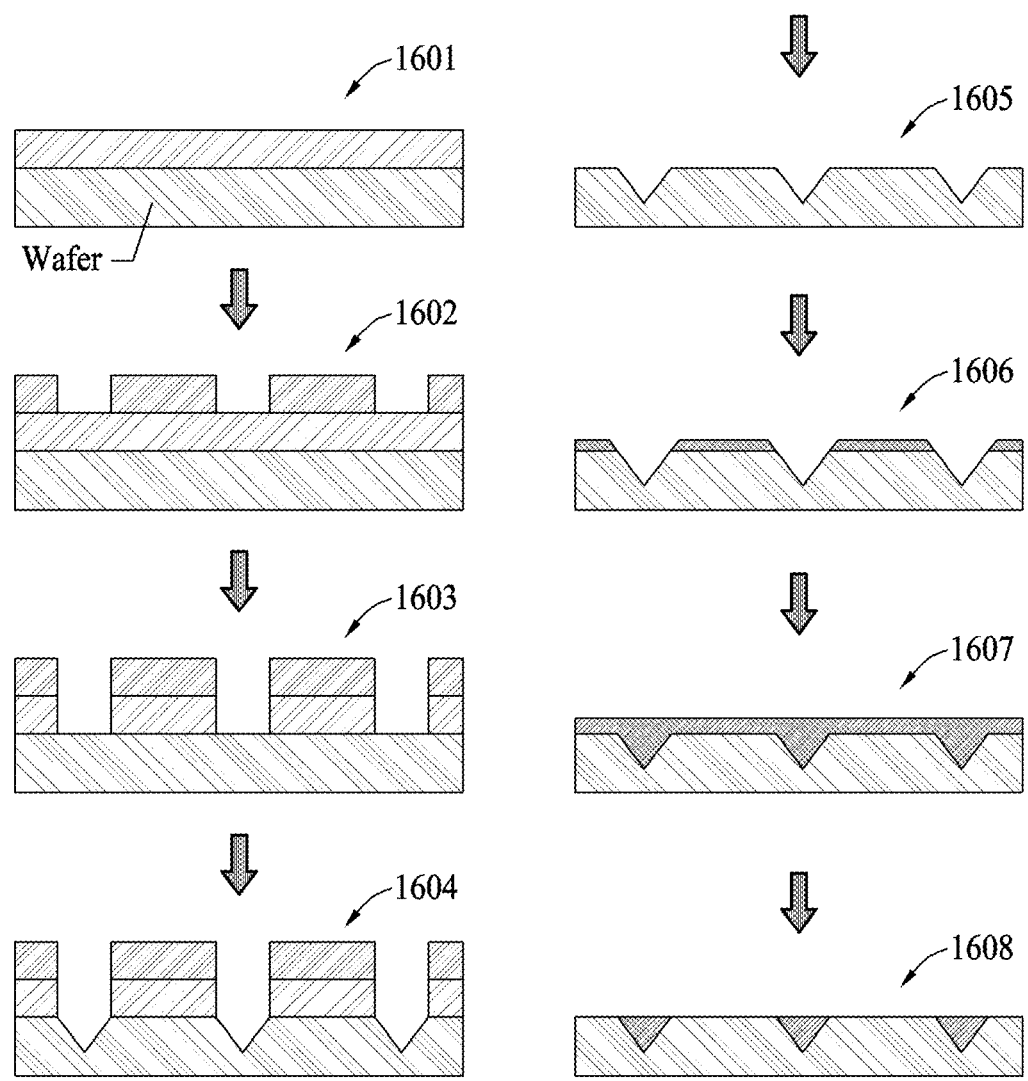

[FIG. 17]
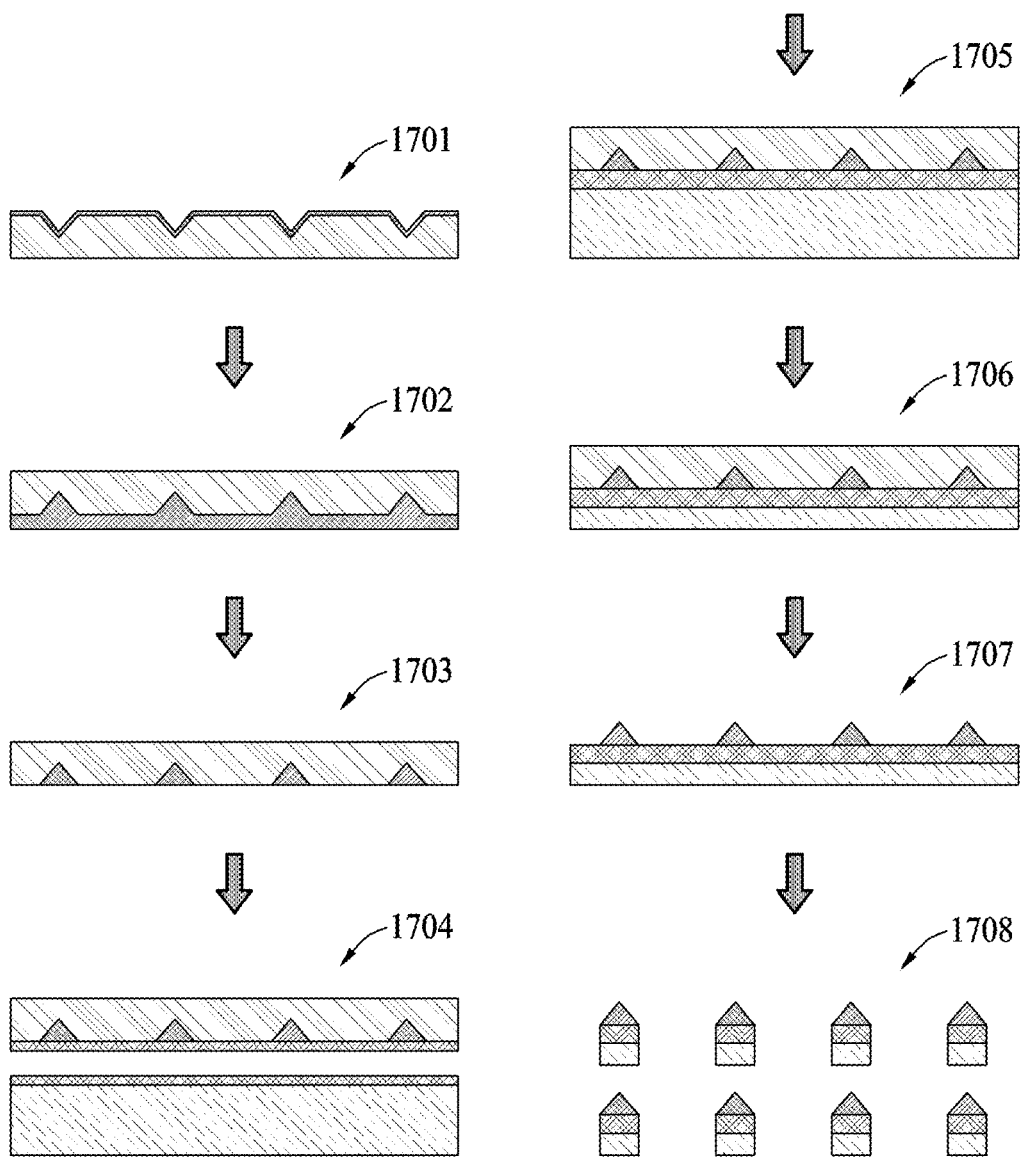

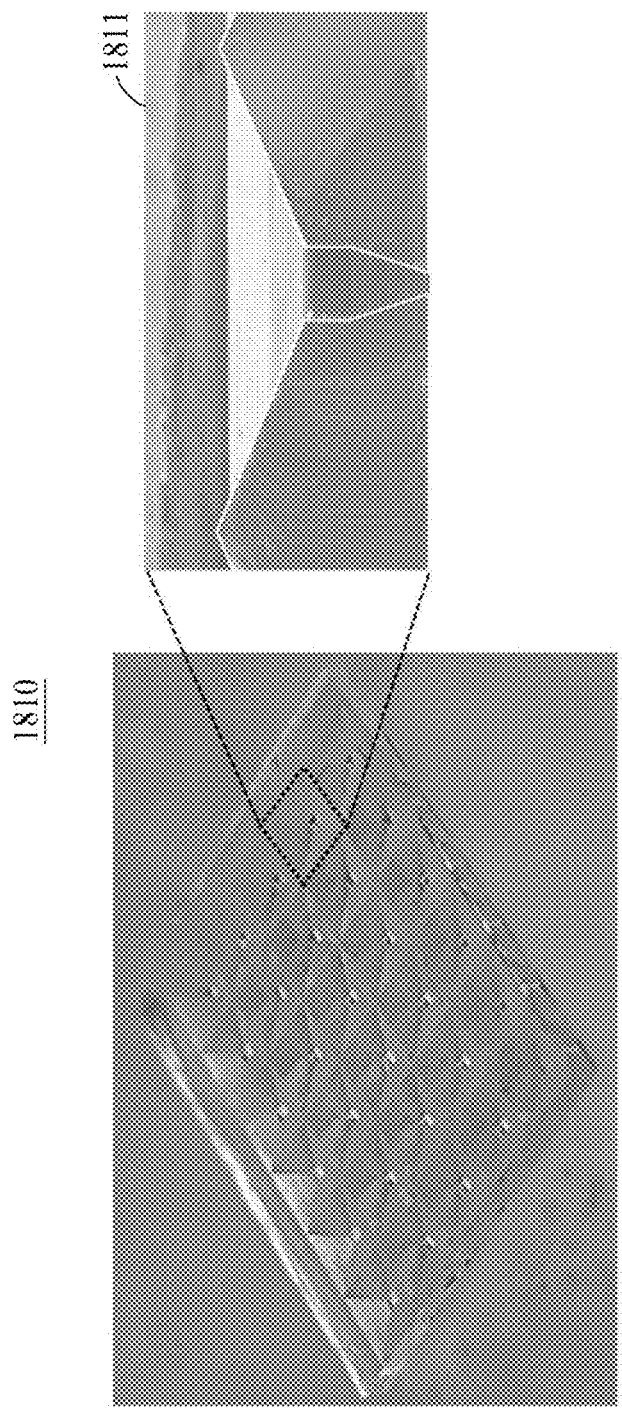
[FIG. 18A]

[FIG. 18B]
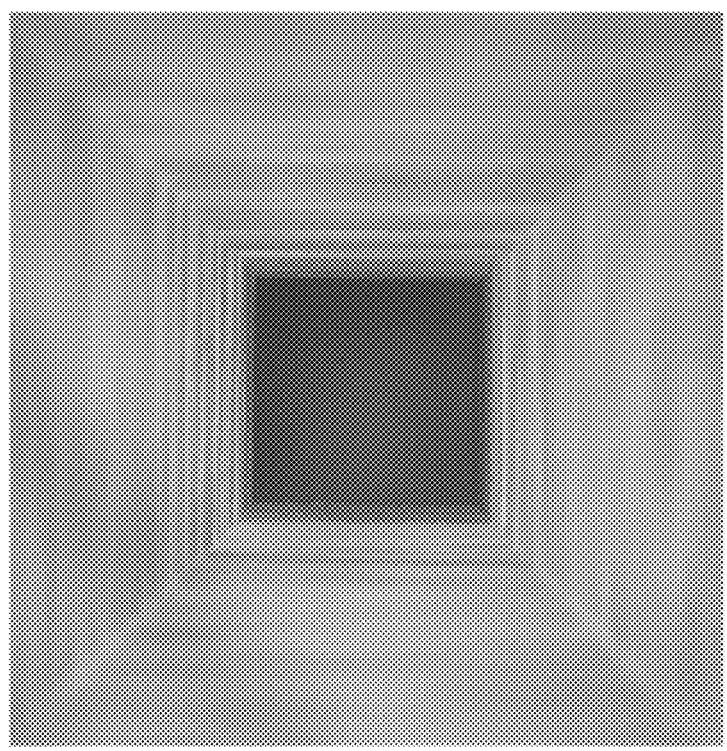
1820

[FIG. 18C]
1830
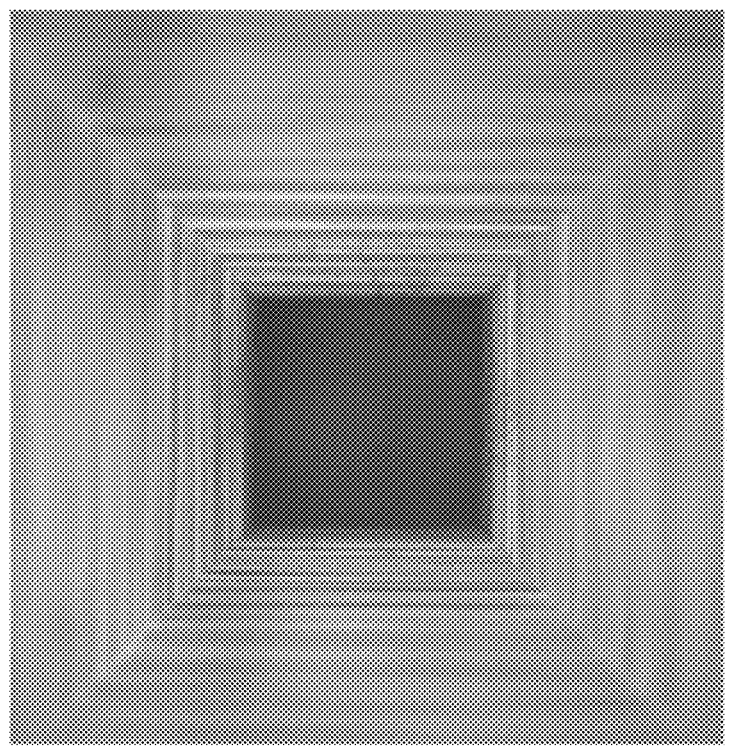

[FIG. 18D]
1840
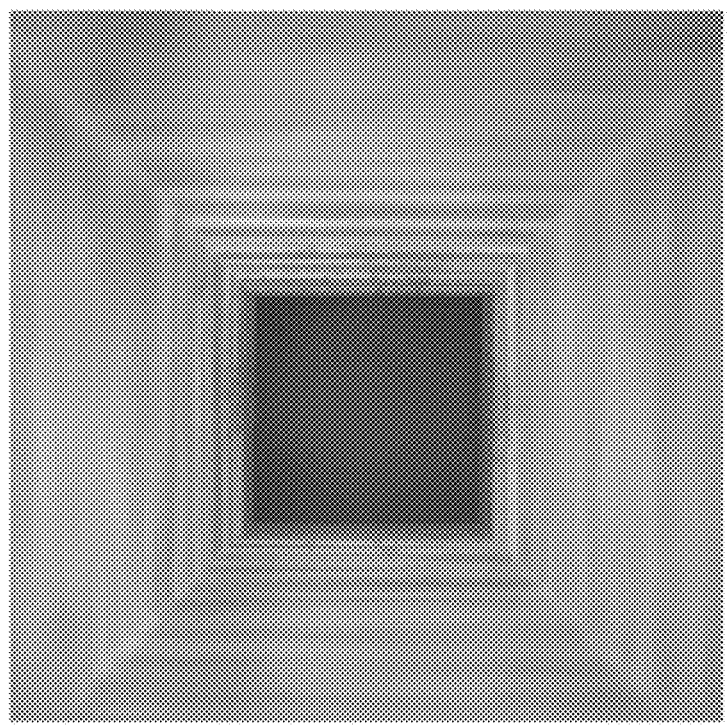

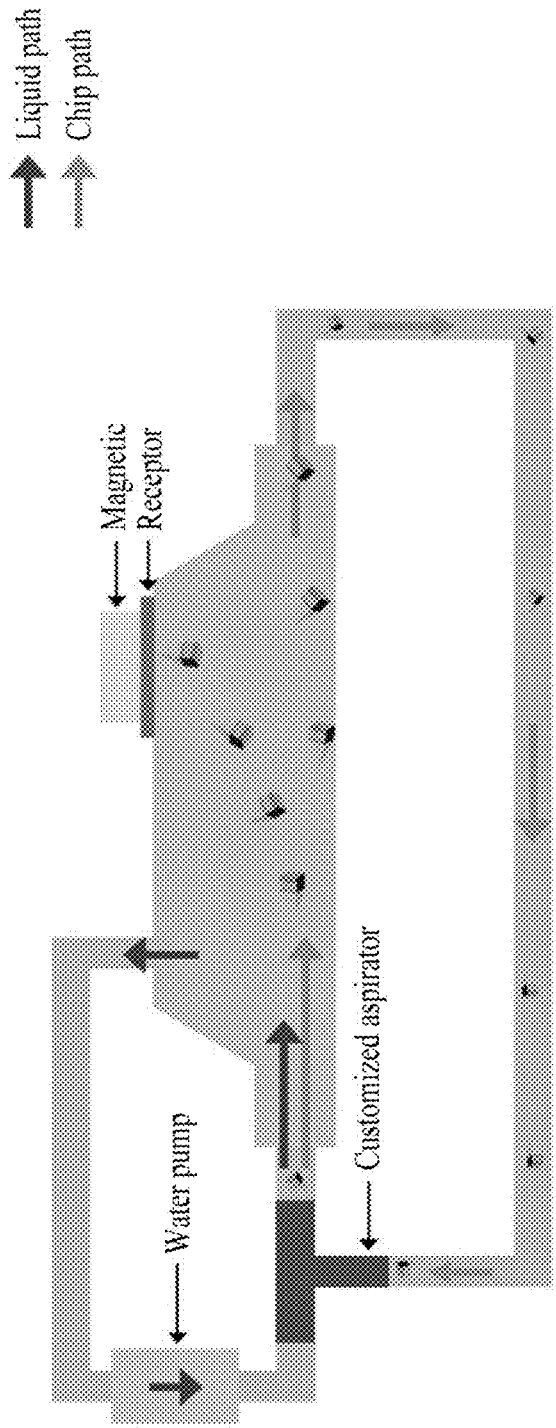
[FIG. 19]

[FIG. 20A]
2010
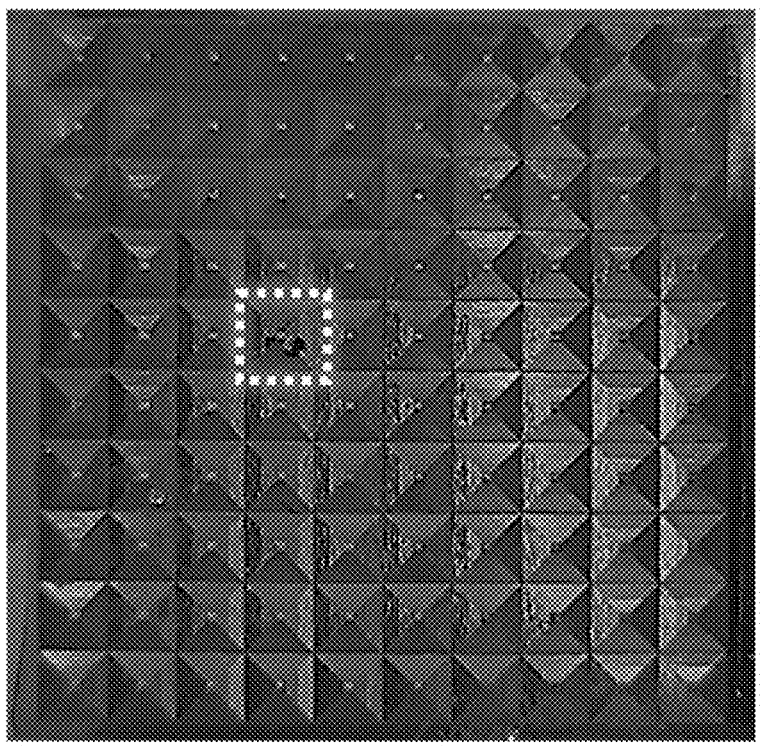
[FIG. 20B]
2020
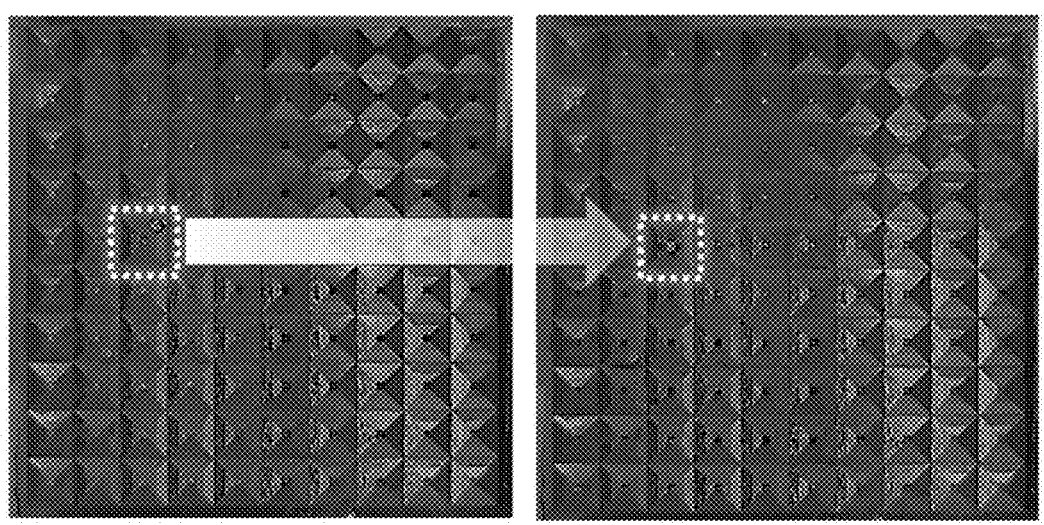

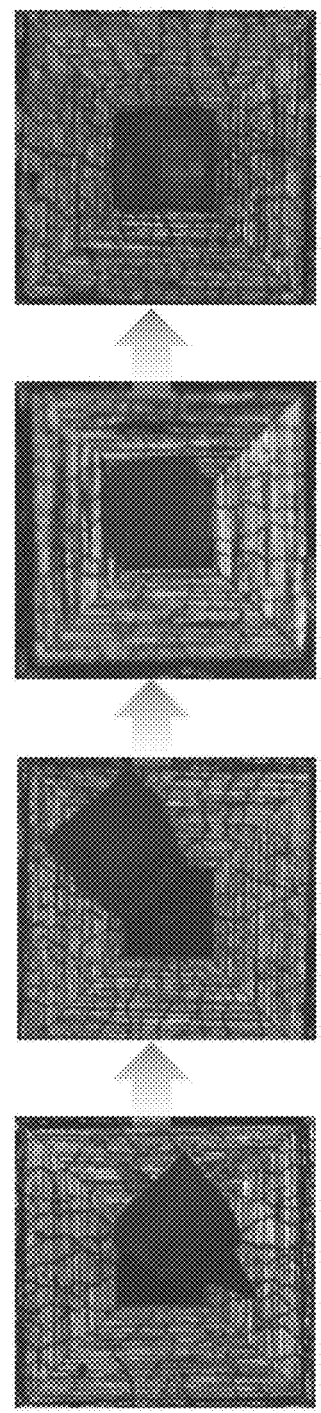
[FIG. 20C]

STRUCTURE OF MICRO LIGHT-EMITTING DEVICE AND METHOD OF TRANSFERRING MICRO LIGHT-EMITTING DEVICE

CROSS-REFERENCE TO RELATED APPLICATION

This application claims priority to Korean Patent Application No. 10-2020-0147435, filed on Nov. 6, 2020 in the Korean Intellectual Property Office, the disclosure of which is incorporated herein by reference.

BACKGROUND OF THE DISCLOSURE

Field of the Disclosure

The present disclosure relates to a micro light-emitting device and an alignment substrate structure, and more particularly, to a method of fabricating a micro light-emitting device applied to lighting devices and displays and a method of transferring the micro light-emitting device.

Description of the Related Art

In 2014, Apple Inc. of the United States acquired Ruxvue Technology, a micro light-emitting device manufacturer. In addition, as Sony of Japan and Barco of China launch micro light-emitting pixel TV prototypes, application of micro light-emitting devices to displays is being realized. If a high-speed transfer process/equipment is developed in the future, it is expected that next-generation flexible lighting devices and displays that surpass micro light-emitting devices will be developed.

Since micro/nano light-emitting devices used in such a display are chemically stable and bio-compatible, the micro/nano light-emitting devices can be applied to various biomedical fields such as cell stimulation, optogenetic treatment, wound treatment, and diagnosis by attaching to or inserting into the body. In addition to smart textiles, bio-contact lenses, head mounted displays, and medical patches, micro/nano light-emitting devices can be implanted in electronic devices integrated with living tissues and used as wearable optical aids.

To fabricate a flexible micro/nano light-emitting device, a process of transferring a separated micro light-emitting device chip to a substrate in a desired arrangement is essential. So far, main transfer methods include an electrostatic pickup method developed by Ruxvue Technology company and a pickup method using an elastomeric material as a print head reported by Rogers group at UIUC University. However, the pick-and-place method has fundamental limitations due to chip damage and low throughput. In addition, there is no company in the world that has commercialized a process of transferring an inorganic GaN-based micro light-emitting device at a mass production level.

RELATED ART DOCUMENTS

Patent Documents

Korean Patent Application No. 10-2001-0080462 "LASER DIODE BAR ALIGNMENT DEVICE"
Korean Patent Application No. 10-2011-0029454 "METHOD OF MAGNETICALLY CONTROLLING MAGNETIC STRUCTURE"

SUMMARY OF THE DISCLOSURE

Therefore, the present disclosure has been made in view of the above problems, and it is an object of the present disclosure to provide a process of transferring a separated micro light-emitting device chip to a substrate in a desired arrangement.

It is another object of the present disclosure to provide a transfer method using inkjet printing.

It is still another object of the present disclosure to provide a micro light-emitting device structure characterized in that two electrodes are simultaneously connected by simple heat treatment after being transferred to an alignment substrate.

It is still another object of the present disclosure to overcome the fundamental limitations of a pick-and-place transfer method, such as damage of a micro light-emitting device chip and low throughput.

It is still another object of the present disclosure to shorten process time and simply repair defective pixels by omitting an additional process of connecting electrodes after transferring.

It is yet another object of the present disclosure to realize micro/nano light-emitting device lighting and display by commercializing a process of transferring an inorganic GaN-based micro light-emitting device to a mass production level.

In accordance with one aspect of the present disclosure, provided is a light-emitting device, wherein the micro light-emitting device has at least one three-dimensional shape of a circular cone shape, a polypyramid shape, and a pyramid shape and includes an inclined side surface having the three-dimensional shape, wherein the inclined side surface is formed to protrude from one surface of the micro light-emitting device, and the inclined side surface has magnetism and includes two different electrodes formed in one direction, wherein, among the two electrodes, one electrode is formed on a mesa portion, and the other electrode is formed on the inclined side surface.

The two different electrodes according to one embodiment may be simultaneously connected to an alignment substrate.

The micro light-emitting devices according to one embodiment may be sprayed into a fluid to obtain an ink containing the micro light-emitting devices, and the ink may be discharged to specific locations of the alignment substrate through at least one method of inkjet printing, electrophoresis, and drop casting. In the alignment substrate, the ink containing the micro light-emitting devices may be guided to a pattern on the alignment substrate by a magnetic field formed on a side opposite to the side to be discharged.

The light-emitting device according to one embodiment may be guided to the pattern so that a tip of the inclined side surface of the micro light-emitting device faces downward.

The micro light-emitting device according to one embodiment may emit at least one color among preset colors, and may be formed to have a preset size corresponding to the at least one color.

The micro light-emitting device according to one embodiment may be formed of at least one of a two-wavelength LED bundle and a three-wavelength LED bundle corresponding to the at least one color.

In accordance with another aspect of the present disclosure, provided is a method of fabricating a micro light-emitting device, wherein the micro light-emitting device has at least one three-dimensional shape of a circular cone shape, a polypyramid shape, and a pyramid shape, and the method includes etching a micro light-emitting device wafer; forming sidewall passivation films on the etched micro light-emitting device wafer; forming n-contact depositions disposed between adjacent sidewall passivation films among the sidewall passivation films; forming eutectic layer depositions on the micro light-emitting device on which the sidewall passivation films are formed; bonding a template TCB on the eutectic layer depositions; grinding the bonded template TCB; and dicing the micro light-emitting device in a form in which the bonded template TCB is ground, wherein, in the grinding, an inclined side surface protruding from one side of the micro light-emitting device is formed, and the inclined side surface is formed to have a shape corresponding to the three-dimensional shape.

The method of fabricating a micro light-emitting device according to one embodiment may further include magnetizing the inclined side surface formed after the grinding, wherein the inclined side surface has magnetism.

In accordance with still another aspect of the present disclosure, provided is a method of transferring a micro light-emitting device, the method including holding an ink nozzle on one side of an alignment substrate and forming a magnetic field on a side opposite to the one side where the ink nozzle is held; and discharging an ink in which micro light-emitting devices having magnetism are dispersed on the alignment substrate while maintaining the magnetic field to be in response to movement of the ink nozzle.

The micro light-emitting device according to one embodiment may be a micro light-emitting device having at least one three-dimensional shape of a circular cone shape, a polypyramid shape, and a pyramid shape and may include an inclined side surface having the three-dimensional shape, wherein the inclined side surface may be formed to protrude from one surface of the micro light-emitting device, and the inclined side surface may have magnetism.

The micro light-emitting device according to one embodiment may include two different electrodes formed in one direction, wherein, among the two electrodes, one electrode may be formed on a mesa portion, and the other electrode may be formed on the inclined side surface.

The discharging of an ink in which micro light-emitting devices having magnetism are dispersed on the alignment substrate while maintaining the magnetic field to be in response to movement of the ink nozzle may include guiding an ink containing the micro light-emitting devices to a pattern on the alignment substrate by a magnetic field formed on a side opposite to the side to be discharged.

In accordance with still another aspect of the present disclosure, provided is a micro light-emitting device including a substrate; and an inclined side surface formed to protrude from one surface of the substrate, having a three-dimensional shape, and performing a function of a p-contact, wherein at least one of an area, a volume, and a weight of the substrate is formed so that a resistance value generated in the substrate according to a generated air flow is greater than or equal to a resistance value generated in the inclined side surface, and the three-dimensional shape of the inclined side surface is a circular cone shape or a polypyramid shape.

In accordance with yet another aspect of the present disclosure, provided is a method of fabricating a micro light-emitting device, wherein the micro light-emitting device has at least one three-dimensional shape of a circular cone shape, a polypyramid shape, and a pyramid shape, and the method includes performing anisotropic etching of a wafer to form at least one groove having an inclined side surface having the three-dimensional shape; forming a magnetic material on a surface on which the groove is formed, and planarizing the surface on which the magnetic material is formed to form magnetic peaks; bonding the wafer on which the magnetic peaks are formed to a wafer on which a light-emitting device is formed to attach the magnetic peaks to the light-emitting device; etching the wafer on which the magnetic peaks are formed to remove portions other than the magnetic peaks; and dicing the light-emitting device to which the magnetic peaks are attached to form the at least one micro light-emitting device.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 illustrates a micro light-emitting device according to one embodiment;

FIG. 2 is a flowchart for explaining a method of fabricating a micro light-emitting device according to one embodiment;

FIG. 3 illustrates a process of fabricating a micro light-emitting device according to one embodiment;

FIG. 4 is a flowchart for explaining a method of transferring a micro light-emitting device according to one embodiment;

FIG. 5 includes drawings for explaining an example in which an alignment substrate and a micro light-emitting device are bonded by eutectic bonding according to one embodiment;

FIG. 6 includes drawings for explaining an example of aligning micro light-emitting devices having a three-dimensional shape using an inkjet printing method;

FIG. 7 includes drawings for explaining a principle that the magnetic peak of a micro light-emitting device is directed downward due to magnetism and an inclined inner wall inside a cartridge;

FIG. 8 is a drawing for explaining an example in which micro light-emitting devices are aligned in one direction by a wind resistance structure;

FIG. 9 illustrates a micro light-emitting device according to a first embodiment;

FIG. 10 illustrates a process of transferring a micro light-emitting device according to a first embodiment;

FIG. 11 illustrates a micro light-emitting device according to a second embodiment;

FIGS. 12A and 12B illustrate a micro light-emitting device according to a third embodiment;

FIG. 13 includes drawings for explaining Preparation Example 1 for a micro light-emitting device according to a third embodiment;

FIG. 14 includes drawings for explaining Preparation Example 2 for a micro light-emitting device according to a third embodiment;

FIG. 15 is a flowchart for explaining a method of fabricating a micro light-emitting device according to another embodiment;

FIG. 16 includes drawings for explaining a magnetic peak fabrication process in a method of fabricating a micro light-emitting device according to another embodiment;

FIG. 17 includes drawings for explaining a process of fabricating a micro light-emitting device according to another embodiment;

FIGS. 18A to 18D are images showing the experimental results of heat-treating a receptor for transferring micro light-emitting devices according to one embodiment;

FIG. 19 illustrates an example of a circulatory system for transferring a micro light-emitting device according to one embodiment; and FIGS. 20A to 20C are images for explaining an actual transfer process for a micro light-emitting device according to one embodiment.

DETAILED DESCRIPTION OF THE DISCLOSURE

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the teachings of the present disclosure.

It should be understood that when an element is referred to as being "connected to" or "coupled to" another element, the element may be directly connected or coupled to the other element or intervening elements may be present. In contrast, when an element is referred to as being "directly connected to" or "directly coupled to" another element, there are no intervening elements present. Other words used to describe the relationship between elements or layers should be interpreted in a like fashion (e.g., "between," versus "directly between," "adjacent," versus "directly adjacent," etc.).

The terms used in the present specification are used for explaining a specific exemplary embodiment, not limiting the present inventive concept. Thus, the expression of singularity in the present specification includes the expression of plurality unless clearly specified otherwise in context. Also, the terms such as "include" or "comprise" are used to specify stated characteristics, numbers, steps, operations, constituent elements, or a combination thereof, but should not be construed to exclude the existence of or a possibility of addition of one or more other characteristics, numbers, steps, operations, constituent elements, or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present disclosure will be described in detail with reference to the accompanying drawings. However, the scope of the present disclosure is not limited by these embodiments. Like reference numerals in the drawings denote like elements.

FIG. 1 illustrates a micro light-emitting device 100 according to one embodiment.

The micro light-emitting device 100 according to one embodiment includes an inclined side surface having a three-dimensional shape, and the inclined side surface is configured to protrude from one surface of the micro light-emitting device. In addition, the inclined side surface has magnetism and includes two different electrodes formed in one direction. In addition, among the two electrodes, one electrode may be formed on a mesa portion, and the other electrode may be formed on the inclined side surface.

For example, the three-dimensional shape may include at least one of a circular cone shape, a polypyramid shape, and a pyramid shape instead of a cone having an inclined angle such as a hemispherical shape or an elliptical shape.

The micro light-emitting device 100 according to one embodiment may include a p-contact 101, a p-GaN 102, an n-contact 103, an n-GaN 104, and a substrate 105.

The p-contact 101 may be aligned in a direction toward an alignment substrate by a magnetic field generated from an electromagnet and bonded to the eutectic material of an alignment substrate.

A paramagnetic material such as Al/Ni/Cr may be mixed with the electrode material of the p-contact 101 or the n-contact 103 or a bonding tip that is a part of the surface of a chip may be coated or doped with the paramagnetic material so that the micro light-emitting device 100 responds to a magnetic field. In addition, a metal tip may be made of a paramagnetic material, and the bonding tip is formed on the upper surface of a light-emitting device so as to be fit into the alignment surface of an alignment substrate, or has a structure coupled to the upper surface. That is, the bonding tip may be formed on the top of a micro light-emitting device formed on a growth substrate. In addition, a separately manufactured bonding tip may be attached to a micro light-emitting device.

A micro light-emitting device structure and an original substrate on which the micro light-emitting device structure is formed may be scribed at the same time without separating the micro light-emitting device from the original substrate, so that a bonding tip is formed on the original substrate.

A structure for accommodating the bonding tip of a micro light-emitting device is formed on the alignment substrate. In the present disclosure, a permanent magnet or an electromagnet applying an AC magnetic field may be used to apply a magnetic field for aligning the tip of a micro light-emitting device.

The n-contact 103 that is formed on the same side as the p-contact 101 and is an electrode opposite to the p-contact 101 may be electrically connected to an adjacent micro light-emitting device.

The substrate 105 may be formed of a transparent material, e.g., a sapphire wafer.

In addition, the micro light-emitting device 100 may emit at least one color among preset colors, and may be formed to have a preset size corresponding to the at least one color.

For example, the micro light-emitting device 100 may be at least one of a red light-emitting device, a green light-emitting device, and a blue light-emitting device.

In addition, when the micro light-emitting device 100 is a green light-emitting device, the micro light-emitting device 100 may be formed to have a first size. When the micro light-emitting device 100 is a blue light-emitting device, the micro light-emitting device 100 may be formed to have a second size smaller than the first size. When the micro light-emitting device 100 is a red light-emitting device, the micro light-emitting device 100 may be formed to have a third size smaller than the second size.

The micro light-emitting device 100 may be formed of at least one of a two-wavelength LED bundle and a three-wavelength LED bundle corresponding to at least one color.

For example, the micro light-emitting device 100 may be formed of a green/blue two-wavelength LED bundle or a red/green/blue (RGB) three-wavelength LED bundle.

FIG. 2 is a flowchart for explaining a method of fabricating a micro light-emitting device according to one embodiment.

In the method of fabricating a micro light-emitting device according to one embodiment, a micro light-emitting device wafer may be etched (step 201).

Next, in the method of fabricating a micro light-emitting device according to one embodiment, sidewall passivation films may be formed (step 202).

In the method of fabricating a micro light-emitting device according to one embodiment, n-contact depositions may be formed to be disposed between adjacent sidewall passivation films (step 203).

In the method of fabricating a micro light-emitting device according to one embodiment, eutectic layer depositions may be formed on the light-emitting device (step 204).

In the method of fabricating a micro light-emitting device according to one embodiment, a template TCB may be bonded onto the eutectic layer depositions (step 205).

In the method of fabricating a micro light-emitting device according to one embodiment, grinding of the bonded template TCB may be performed (step 206).

For example, in the method of fabricating a micro light-emitting device, through grinding, an inclined side surface protruding from one side of the light-emitting device may be formed.

In addition, the inclined side surface may be formed to have a three-dimensional shape. In this case, the three-dimensional shape may include at least one of a circular cone shape, a polypyramid shape, and a pyramid shape.

In the method of fabricating a micro light-emitting device according to one embodiment, dicing of the light-emitting device in the form in which the bonded template is ground may performed (step 207).

In the method of fabricating a micro light-emitting device according to one embodiment, the inclined side surface formed after grinding may be magnetized.

Both electrodes of the micro light-emitting device having a three-dimensional shape are formed in one direction. In addition, one electrode of the micro light-emitting device may be formed on a mesa and the other electrode may be formed on the inclined side surface. That is, both electrodes of the light-emitting device may be connected to the alignment substrate at the same time.

FIG. 3 illustrates a process 300 of fabricating a micro light-emitting device according to one embodiment.

According to the process 300 of fabricating a micro light-emitting device, first, as shown in reference numeral 301, a micro light-emitting device may be formed on a wafer made of a sapphire material. Next, as shown in reference numeral 302, etching of the micro light-emitting device may be performed, and as shown in reference numeral 303, sidewall passivation films may be formed.

In addition, according to the process 300 of fabricating a micro light-emitting device, n-contact depositions may be formed to be disposed between adjacent sidewall passivation films (304), and as shown in reference numeral 305, eutectic layer depositions may be formed on the light-emitting device (305).

Next, as shown in reference numeral 306, a template TCB may be bonded on the eutectic layer depositions (306), and as shown in reference numeral 307, the bonded template TCB may be ground to fabricate micro light-emitting devices each including an inclined side surface. The inclined side surface may have a three-dimensional shape such as a circular cone shape or a polypyramid shape, Next, in the process 300 of fabricating a micro light-emitting device according to one embodiment, dicing of the micro light-emitting devices may be performed to obtain separated micro-scale micro light-emitting devices.

As a specific example, as another embodiment of forming the pyramid-shaped tip of a light-emitting device coupled to an alignment substrate, a method of forming a bonding portion using Si and then placing a metal thereon may be applied.

First, a $SiO_2$ layer may be grown on a Si surface, the layer may be coated with a photoresist, the PR may be patterned, the $SiO_2$ layer may be etched with BOE using the PR pattern as a mask, and the PR may be removed. Using the mask formed in this way, Si may be etched using a KOH solution, and then $SiO_2$ may be removed. The micro light-emitting devices indicated by dotted lines are aligned in the space formed in this way. When metal is deposited on the shape formed on Si, a space is filled with a metal material to form an intended shape, and then a visible surface is flattened, as the Si layer is removed, the intended shape of the bonding portion may appear.

An independent micro light-emitting device may be fabricated by attaching a metal layer having the shape of the bonding portion on the surface on which the structures of the light-emitting devices are laminated (108) and separating the chip by laser scribing.

FIG. 4 is a flowchart for explaining a method of transferring a micro light-emitting device according to one embodiment.

In the method of transferring a micro light-emitting device according to one embodiment, an ink nozzle may be held on one side of an alignment substrate (step 401).

Next, in the method of transferring a micro light-emitting device according to one embodiment, a magnetic field may be formed on a side opposite to one side on which the ink nozzle is held (step 402).

For example, by placing an electromagnet having a magnetic field on the opposite side and controlling the electromagnet to move in response to movement of the ink nozzle, a magnetic field may be formed in the side opposite to one side on which the ink nozzle is held.

While the magnetic field is maintained to be in response to movement of the ink nozzle, an ink in which the micro light-emitting devices having magnetism are dispersed may be discharged on the alignment substrate (step 403).

The light-emitting device according to one embodiment is a light-emitting device having a three-dimensional shape including at least one of a circular cone shape, a polypyramid shape, and a pyramid shape, includes an inclined side surface having a three-dimensional shape, and the inclined side surface is formed to protrude from one surface of the light-emitting device.

In addition, the light-emitting device according to one embodiment includes two different electrodes formed in one direction. Among the two electrodes, one electrode may be formed in the form of a mesa electrode structure, and the other electrode may be formed on the inclined side surface.

FIG. 5 includes drawings for explaining an example in which an alignment substrate and a micro light-emitting device are bonded by eutectic bonding according to one embodiment.

Reference numeral 510 shows a process 500 of eutectic bonding.

The p-contact of a micro light-emitting device may be bonded to an alignment substrate in a downward direction. In this process, an n-contact may be electrically connected to the n-contact of an adjacent micro light-emitting device, and the p-contact may be bonded to a eutectic material 520.

FIG. 6 includes drawings for explaining an example of aligning micro light-emitting devices having a three-dimensional shape using an inkjet printing method.

Reference numeral 610 shows a process of discharging a micro light-emitting device together with a fluid through an inkjet nozzle and bonding the micro light-emitting device to an alignment substrate without a magnetic field. Reference numeral 620 shows an example in which a micro light-emitting device is discharged together with a fluid through an inkjet nozzle and the micro light-emitting device is bonded to an alignment substrate using a magnetic field.

In the embodiment of reference numeral 610, since the p-contact corresponding to the inclined side surface does not face the alignment substrate, but faces the opposite direction, smooth bonding to the alignment substrate is difficult.

In addition, in the embodiment of reference numeral 620, the p-contact corresponding to the inclined side surface has a magnetic field, and a magnetic is placed on the opposite side of the alignment substrate, so that the micro light-emitting device faces the alignment substrate, so bonding may be performed quickly and in batches.

According to the present disclosure, by placing an ink nozzle on one side of the alignment substrate and applying a magnetic field to the opposite side, the discharged micro light-emitting device may be seated on the pattern without being overturned in response to the magnetic field. In addition, the fundamental limitations of a pick-and-place transfer method, such as damage of a micro light-emitting device chip and low throughput may be overcome.

In addition, when the present disclosure is used, an additional process of connecting electrodes after transferring is not required. Thus, process time may be shortened, and defective pixels may be simply repaired. In addition, micro/nano light-emitting device lighting and display may be realized by commercializing a process of transferring an inorganic GaN-based micro light-emitting device to a mass production level.

FIG. 7 includes drawings for explaining a principle that the magnetic peak of a micro light-emitting device is directed downward due to magnetism and an inclined inner wall inside a cartridge 710 containing a fluid in which the micro light-emitting device is immersed.

Reference numeral 720 corresponds to a magnetic bottom surface. Since the micro light-emitting device according to the present disclosure has a magnetic field on the inclined side surface of the p-contact, the micro light-emitting device may be waiting to be discharged toward the bottom surface 720.

In an inkjet nozzle 730, the micro light-emitting device together with a fluid may be discharged in a state in which the p-contact is well aligned in a downward direction as shown in reference numeral 740.

The p-contact, which is the uppermost portion of the micro light-emitting device, may slide into the alignment substrate through the inkjet nozzle 730 while sliding a partition wall 750 inside the cartridge 710. Accordingly, a success rate in which the micro light-emitting device is seated may be significantly increased. When a magnetic field is applied to a substrate for alignment of the light-emitting device having such a structure, and magnetic force is applied to the front end of the light-emitting device, the light-emitting device is transferred to a panel to be aligned. At this time, since the structure of the chip in the n-GaN direction is relatively heavy compared to the structure in the p-GaN direction, the n-GaN direction is directed toward the gravitational direction, so that the directivity may be determined.

FIG. 8 is a drawing for explaining an example in which micro light-emitting devices are aligned in one direction by a wind resistance structure.

Specifically, the substrate portion of a micro light-emitting device 850 having a three-dimensional shape may have a structure capable of receiving resistance from wind, such as a dandelion spore or an umbrella. In addition, the light-emitting device may be floated by air or a small wind, and the inclined side surface thereof may be directed downward as the light-emitting device sinks.

From one side of the micro light-emitting device falling in the direction of the alignment substrate, an air flow may be generated into the micro light-emitting device.

In addition, in the method of transferring a micro light-emitting device, the micro light-emitting device may be aligned so that the p-contact of the micro light-emitting device faces the alignment substrate according to generated air flow, and the aligned micro light-emitting device may be seated on the alignment substrate.

In this case, at least one of an area, a volume, and a weight of the substrate may be formed so that a resistance value generated in the substrate of the micro light-emitting device is equal to or greater than a resistance value generated in the p-contact according to generated air flow. In addition, the p-contact may have at least one inclined side surface, and may have at least one of a circular cone shape, a polypyramid shape, and a pyramid shape.

For example, the substrate of the micro light-emitting device 850 has a structure in which air resistance may occur greatly when moving in the direction of gravity, such as the pappus of a dandelion spore, an umbrella, or a parachute cloth. In the p-contact portion of the micro light-emitting device 850, inclined side surfaces gather to form a peak, and thus, the p-contact portion generates relatively less resistance than the substrate portion when moving in the gravitational direction.

Accordingly, when wind is generated from one side of the micro light-emitting device 850, due to the structural characteristics of the substrate and the peak, the p-contact portion of the micro light-emitting device 850 may be guided downward, i.e., toward the alignment substrate in the direction of gravity.

That is, as shown in reference numeral 810, when wind is blown into the micro light-emitting device 850 in the chamber 820, the p-contact may be positioned to face an alignment substrate 830.

In this case, the p-contact has a magnetic field, and by disposing an electromagnet 840 at the lower end of the alignment substrate 830, the p-contact may be positioned to face the alignment substrate 830.

According to the present disclosure, the micro light-emitting device chip may be quickly and accurately transferred to the alignment substrate.

In addition, by arranging both anode and cathode electrodes on one side, bonding between the alignment substrate and the micro light-emitting device may be facilitated.

In addition, by inserting a structure capable of receiving wind resistance in the substrate of the micro light-emitting device, the light micro light-emitting device may be lightly suspended in the air by air or wind. In addition, by discharging the micro light-emitting device ink to a desired position on the alignment substrate using inkjet printing technology, the micro light-emitting device having a size of several microns may be transferred quickly and accurately.

FIG. 9 illustrates a micro light-emitting device according to a first embodiment.

The micro light-emitting device according to the first embodiment may include at least one of a green light-emitting device 901, a blue light-emitting device 902, and a red light-emitting device 903.

In addition, the green light-emitting device 901 may be formed to have a first size, the blue light-emitting device 902 may be formed to have a second size smaller than the first size, and the red light-emitting device 903 may be formed to have a third size smaller than the second size.

That is, light-emitting device receptor holes provided in an alignment substrate 904 may be formed in different sizes corresponding to the respective sizes of the green light-emitting device 901, the blue light-emitting device 902, and the red light-emitting device 903.

In addition, when a substrate provided in the red light-emitting device 903 is not a sapphire substrate, the red light-emitting device 903 may be mounted on the receptor hole of the alignment substrate 904, and then the substrate may be removed.

FIG. 10 illustrates a process of transferring the micro light-emitting device according to the first embodiment.

According to the process of transferring the micro light-emitting device according to the first embodiment (reference numerals 1001 to 1003), each of micro light-emitting devices implemented as a green light-emitting device, a blue light-emitting device, and a red light-emitting device may be transferred to the corresponding light-emitting device receptor holes of an alignment substrate.

For example, the process of transferring the micro light-emitting device may be performed in the order of a light-emitting device having a large size to a light-emitting device having a small size, i.e., in the order of a green light-emitting device, a blue light-emitting device, and a red light-emitting device.

Specifically, as shown in reference numerals 1001 to 1003, when a magnetic field is formed using a magnet after a green light-emitting device is transferred, the green light-emitting device is accurately accommodated in a receptor hole corresponding to the green light-emitting device, but the green light-emitting device having a large size may not be accommodated in a receptor hole corresponding to a blue or red light-emitting device. Thereafter, when the magnetic field is removed, the green light-emitting device that is not accommodated in the receptor hole corresponding to the blue or red light-emitting device is detached, and the green light-emitting device may be accommodated only in a receptor hole corresponding to the green light-emitting device.

When a transfer process for a blue light-emitting device is performed in the same way, the blue light-emitting device may be accommodated only in a receptor hole corresponding to the blue light-emitting device.

FIG. 11 illustrates a micro light-emitting device according to a second embodiment.

The micro light-emitting device according to the second embodiment may be implemented as a two-wavelength LED bundle 1101 of blue 1101-a/green 1101-b, or may be implemented as a single red light-emitting device 1102. In addition, the two-wavelength LED bundle 1101 may be formed to a size larger than that of the red light-emitting device 1102.

That is, light-emitting device receptor holes provided in an alignment substrate 1103 may be formed in different sizes corresponding to the respective sizes of the two-wavelength LED bundle 1101 of 1101-a/green 1101-b and the red light-emitting device 1102. In the alignment substrate 1103, through two transfer processes for each of the two-wavelength LED bundle 1101 and the red light-emitting device 1102 independently fabricated, each bundle and device may be mounted in corresponding receptor holes.

For example, the two-wavelength LED bundle 1101 may be formed by forming and bundling the blue light-emitting device 1101-a and the green light-emitting device 1101-b on one wafer, and then attaching a P-contact having a three-dimensional shape such as a circular cone shape or a polypyramid shape the upper portion of the bundled device.

FIGS. 12A and 12B illustrate a micro light-emitting device according to a third embodiment.

The micro light-emitting device according to the third embodiment may be implemented as a three-wavelength LED bundle of red/green/blue (RGB).

For example, bundling of the three-wavelength LED bundle may be performed by forming a green light-emitting device, a blue light-emitting device, and a red light-emitting device on one wafer. In addition, the three-wavelength LED bundle may include a dual pad.

Specifically, the three-wavelength LED bundle may include one common p-contact 1204 and three n-contacts 1201, 1202, and 1203 for emitting green, blue, and red, respectively. In this case, the p-contact 1204 may have at least one three-dimensional shape of a circular cone shape, a polypyramid shape, and a pyramid shape.

For example, the three n-contacts 1201, 1202, and 1203 may include the red light-emitting contact 1201, the green light-emitting contact 1202, and the blue light-emitting contact 1203. The red light-emitting contact 1201 may be connected to a red light-emitting device through a first via, the green light-emitting contact 1202 may be connected to a green light-emitting device through a second via, and the blue light-emitting contact 1203 may be connected to a blue light-emitting device through a third via.

That is, the three-wavelength LED bundle may simultaneously/individually control driving of green/blue/red light emission through the three n-contacts 1201, 1202, and 1203.

That is, the micro light-emitting device according to the third embodiment (three-wavelength LED bundle) may form red/green/blue (RGB) as one pixel through a single transfer process, so that a relatively large chip may be advantageously implemented.

FIG. 13 includes drawings for explaining Preparation Example 1 for a micro light-emitting device according to a third embodiment.

According to Preparation Example 1, first, as shown in reference numeral 1301, a micro light-emitting device may be formed on a wafer made of a sapphire material (i.e., substrate), and patterning of a photoresist (PR) may be performed on the formed micro light-emitting device.

Next, as shown in reference numeral 1302, a region of the light-emitting device where PR patterning is absent may be etched (i.e., GaN etching), and as shown in reference numeral 1303, the PR may be removed to form a red light-emitting device (R), a green light-emitting device (G), and a blue light-emitting device (B).

Next, as shown in reference numeral 1304, the substrate on which the light-emitting device is formed may be planarized. For example, the planarization process may be performed using $SiN_x$.

Next, as shown in reference numeral 1305, metal layers of predetermined patterns may be formed on the planarized surface. Then, as shown in reference numeral 1306, $SiN_x$ passivation films may be formed between the metal layers.

For example, the metal layers may include three n-contacts (red light-emitting contact, green light-emitting contact, and blue light-emitting contact).

Next, as shown in reference numeral 1307, a P-contact having a three-dimensional shape such as a circular cone shape or a polypyramid shape may be formed on the metal layer simultaneously connected to the red light-emitting device (R), the green light-emitting device (G), and the blue light-emitting device (B) among the metal layers to complete a micro light-emitting device. Then, as shown in reference numeral 1308, the substrate may be removed from the fabricated micro light-emitting device using a laser beam.

FIG. 14 includes drawings for explaining Preparation Example 2 for a micro light-emitting device according to a third embodiment.

According to Preparation Example 2, as shown in reference numeral 1401, n-GaN may be grown on a wafer made of a sapphire material (i.e., substrate), and as shown in reference numeral 1402, the surface on which n-GaN is grown may be patterned with $SiO_2$.

Next, as shown in reference numeral 1403, regrowth of GaN may be performed. Then, as shown in reference numeral 1404, a red light-emitting device (R), a green light-emitting device (G), and a blue light-emitting device (B) may be formed.

Next, as shown in reference numeral 1405, the substrate on which the light-emitting devices are formed may be planarizied, and as shown in reference numeral 1406, metal layers of predetermined patterns may be formed on the planarized surface. Then, as shown in reference numeral 1407, $SiN_x$ passivation films may be formed between the metal layers.

For example, the metal layers may include three n-contacts (red light-emitting contact, green light-emitting contact, and blue light-emitting contact).

Next, as shown in reference numeral 1408, a P-contact having a three-dimensional shape such as a circular cone shape or a polypyramid shape may be formed to complete a micro light-emitting device.

FIG. 15 is a flowchart for explaining a method of fabricating a micro light-emitting device according to another embodiment.

In the method of fabricating a micro light-emitting device according to another embodiment, first, anisotropic etching of a wafer may be performed to form at least one groove having an inclined side surface having a three-dimensional shape. For example, the three-dimensional shape may include at least one of a circular cone shape, a polypyramid shape, and a pyramid shape (step 1501).

Next, in the method of fabricating a micro light-emitting device according to another embodiment, a magnetic material may be formed on a surface on which the groove is formed, and the surface on which the magnetic material is formed may be planarized to form magnetic peaks (step 1502). For example, the surface planarization process may be performed through chemical mechanical polishing (CMP).

Next, in the method of fabricating a micro light-emitting device according to another embodiment, the wafer on which the magnetic peaks are formed may be bonded to a wafer on which a light-emitting device is formed to attach the magnetic peaks to the light-emitting device (step 1503).

Next, in the method of fabricating a micro light-emitting device according to another embodiment, the wafer on which the magnetic peaks are formed may be etched to remove portions other than the magnetic peaks (step 1504).

Next, in the method of fabricating a micro light-emitting device according to another embodiment, dicing of the light-emitting device on which the magnetic peaks are attached may be performed to form at least one micro light-emitting device (step 1505).

The method of fabricating a micro light-emitting device according to another embodiment will be described in more detail with reference to FIGS. 16 and 17.

FIG. 16 includes drawings for explaining a magnetic peak fabrication process in a method of fabricating a micro light-emitting device according to another embodiment.

According to the method of fabricating a micro light-emitting device according to another embodiment, through anisotropic etching of a wafer (reference numerals 1601 to 1605), and formation of a magnetic material and a planarization process (reference numerals 1606 to 1608), magnetic peaks may be formed.

Specifically, according to the magnetic peak fabrication process (reference numerals 1601 to 1608), as shown in reference numeral 1601, a $SiO_2$ layer may be formed on a wafer. In this case, the wafer may be a silicon (Si) wafer, without being limited thereto.

Next, as shown in reference numeral 1602, the $SiO_2$ layer may be coated with a photoresist (PR), and then patterning may be performed. For example, PR patterns formed on the $SiO_2$ layer may have a length of 100 μm, and the spacing between the patterns may be 50 μm, without being limited thereto.

Next, as shown in reference numeral 1603, openings may be formed by etching a region where the PR patterns are not formed in the $SiO_2$ layer. In this case, the etching process may be performed through at least one of buffered oxide etch (BOE) and reactive ion etch (RIE).

Next, as shown in reference numeral 1604, regions corresponding to the openings formed in the wafer may be etched to form at least one groove having an inclined side surface having a three-dimensional shape.

For example, in reference numeral 1604, at least one groove may be formed through a wet etching process based on a potassium hydroxide (KOH) solution. In addition, at least one groove may be formed to have a depth of 35 μm, without being limited thereto.

Next, as shown in reference numeral 1606, in the wafer, a metal seed layer may be formed on a surface on which at least one groove is formed, and as shown in reference numeral 1607, the seed layer may be grown through electroplating to form a magnetic material.

Next, as shown in reference numeral 1608, in the wafer, the surface on which the magnetic material is formed may be planarized. Thereby, magnetic peaks having a three-dimensional shape may be formed by allowing the magnetic material to exist only in the grooves.

FIG. 17 includes drawings for explaining a process of fabricating a micro light-emitting device according to another embodiment.

In the method of fabricating a micro light-emitting device according to another embodiment, through boning a wafer on which magnetic peaks are formed to a light-emitting device wafer (reference numerals 1701 to 1706), etching of the wafer on which the magnetic peaks are formed (1707), and a dicing process (1708), at least one the micro light-emitting device may be formed.

Specifically, as shown in reference numerals 1701 to 1703, a magnetic material may be formed on a wafer on which at least one groove having an inclined side surface having a three-dimensional shape is formed, and then a surface on which the magnetic material is formed may be planarized to form at least one magnetic peak on the wafer.

That is, processes according to reference numerals 1701 to 1703 may be performed in the same manner as processes according to reference numerals 1606 to 1608 described with reference to FIG. 16.

Next, as shown in reference numeral 1704, in the wafer on which magnetic peaks are formed, a bonding layer may be formed on a surface on which the magnetic peaks are formed. In a wafer on which a light-emitting device is formed, a bonding layer may be formed on a surface on which a light-emitting device is formed.

Next, as shown in reference numeral 1705, bonding (TCB bonding) to the wafer on which the light-emitting device is formed may be performed using the formed bonding layer.

Next, as shown in reference numeral 1706, in the wafer on which the light-emitting device is formed, the other side opposite to one side bonded to the wafer on which magnetic peaks are formed may be ground.

Next, as shown in reference numeral 1707, portions other than the magnetic peaks may be removed by etching the wafer on which the magnetic peaks are formed. That is, a silicon mold may be removed from the silicon wafer on which the magnetic peaks are formed.

Next, as shown in reference numeral 1708, dicing of the light-emitting device to which the magnetic peaks are attached may be performed to form the at least one micro light-emitting device.

FIGS. 18A to 18D are images showing the experimental results of heat-treating a receptor for transferring micro light-emitting devices according to one embodiment.

Reference numeral 1810 shows an optical image of a receptor for transferring micro light-emitting devices having magnetic peaks. In this case, the receptor may be formed of a PDMS material, and may be composed of a plurality of units 1811. Each of units 1811 may be provided with a receptor hole.

Reference numeral 1820 shows an optical image of the receptor units 1811 without heat treatment, reference numeral 1830 shows an optical image of the receptor units 1811 heat-treated at 350° C., and reference numeral 1840 shows an optical image of the cold-treated receptor units 1811.

Specifically, the PDMS receptor did not show significant external change even during heat treatment at a high temperature of 350° C. for 10 minutes.

That is, considering that a conventional soldering process is performed at a temperature of 300° C. or less, it was determined that the PDMS receptor exhibited high reliability in high-temperature heat treatment.

FIG. 19 illustrates an example of a circulatory system for transferring a micro light-emitting device according to one embodiment.

The circulation system may be designed so that a chip path and a liquid path are separated from each other to prevent damage to chips (i.e., the micro light-emitting devices), and may be designed so that chips that are not transferred by magnetic force may be circulated and retransferred.

FIGS. 20A to 20C are images for explaining an actual transfer process for a micro light-emitting device according to one embodiment.

Reference numeral 2010 shows a transfer result when a micro light-emitting device transferred to a receptor is not induced with a magnetic field, reference numeral 2020 shows a transfer result when a micro light-emitting device transferred to a receptor is induced with a magnetic field, and reference numeral 2030 shows a process (transfer process) in which the transfer result of reference numeral 2020 is derived.

Specifically, as shown in reference numeral 2010, when a magnetic field for aligning the magnetic peaks of a micro light-emitting device is not applied, the micro light-emitting device is not accurately transferred to the receptor hole of a target receptor unit.

On the other hand, as shown in reference numerals 2020 and 2030, when a magnetic field for aligning the magnetic peaks of a micro light-emitting device is applied, the magnetic peak of the micro light-emitting device is guided in the direction of a receptor hole, and is precisely transferred to the receptor hole of a target receptor.

According to one embodiment, a micro light-emitting device chip can be quickly and accurately transferred to an alignment substrate.

According to one embodiment, by arranging both anode and cathode electrodes on one side, bonding between an alignment substrate and a micro light-emitting device can be facilitated.

According to one embodiment, by inserting a structure capable of receiving wind resistance in the substrate of a micro light-emitting device, the light micro light-emitting device can be lightly suspended in the air by air or wind.

According to one embodiment, by discharging a micro light-emitting device ink to a desired position on an alignment substrate using inkjet printing technology, the micro light-emitting device having a size of several microns can be transferred quickly and accurately.

According to one embodiment, by placing an ink nozzle on one side of an alignment substrate and applying a magnetic field to the other side, a discharged micro light-emitting device can be seated on a pattern without being overturned in response to a magnetic field.

According to one embodiment, the fundamental limitations of a pick-and-place transfer method, such as damage of a micro light-emitting device chip and low throughput, can be overcome.

According to one embodiment, since an additional process of connecting electrodes after transferring is not required, process time can be shortened, and defective pixels can be simply repaired.

According to one embodiment, by commercializing a process of transferring an inorganic GaN-based micro light-emitting device to a mass production level, micro/nano light-emitting device lighting and display can be realized.

The apparatus described above may be implemented as a hardware component, a software component, and/or a combination of hardware components and software components. For example, the apparatus and components described in the embodiments may be achieved using one or more general purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications executing on the operating system. In addition, the processing device may access, store, manipulate, process, and generate data in response to execution of the software. For ease of understanding, the processing apparatus may be described as being used singly, but those skilled in the art will recognize that the processing apparatus may include a plurality of processing elements and/or a plurality of types of processing elements. For example, the processing apparatus may include a plurality of processors or one processor and one controller. Other processing configurations, such as a parallel processor, are also possible.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

What is claimed is:

1. A three-dimensional shaped micro light-emitting device comprising:
    a structure including an inclined side surface, p-contact, p-GaN, n-contact, n-GaN, a substrate, and a wind resistance structure,
    wherein the inclined side surface has a circular cone shape or a pyramid shape,
    wherein the structure including the inclined side surface has magnetism and protrudes from the p-GaN,
    wherein the p-contact and the n-contact form a first electrode and a second electrode, respectively,
    wherein the p-contact is disposed to contact the structure including the inclined side surface,
    wherein the n-contact is disposed on a mesa portion,
    wherein the inclined side surface, the p-contact, the p-GaN, the n-contact, and the n-GaN are disposed on a first surface of the substrate, and the wind resistance structure is disposed on a second surface of the substrate opposite to the first surface of the substrate.

2. The three-dimensional shaped micro light-emitting device according to claim 1, wherein the p-contact and the n-contact are simultaneously connected to an alignment substrate.

3. The three-dimensional shaped micro light-emitting device according to claim 2, wherein a plurality of the three-dimensional shaped micro light-emitting devices are injected into a fluid and made into an ink, discharged at a specific location on the alignment substrate through inkjet printing technology, and
    in the alignment substrate, the ink including the plurality of the three-dimensional shaped micro light-emitting devices is guided to a pattern on the alignment substrate by a magnetic field applied on a side opposite to another side for the plurality of the three-dimensional shaped micro light-emitting devices to be discharged.

4. The three-dimensional shaped micro light-emitting device according to claim 1, wherein the structure including the inclined side surface includes a paramagnetic material to maintain a tip of the structure including the inclined side surface facing downward in response to a magnetic field and the paramagnetic material is included in the structure including the inclined side surface by at least one of the following ways: a first method of constituting the structure including the inclined side surface, and a second method of coating on the surface of the structure including the inclined side surface.

5. The three-dimensional shaped micro light-emitting device according to claim 1, wherein the wind resistance structure includes resistance wings that progressively widen from the second surface of the substrate to a direction away from the second surface of the substrate, and guides the structure including the inclined side surface toward a direction of an alignment substrate by using difference in air resistance caused by the resistance wings.

* * * * *